United States Patent
Arthur et al.

(10) Patent No.: US 9,123,798 B2
(45) Date of Patent: Sep. 1, 2015

(54) INSULATING GATE FIELD EFFECT TRANSISTOR DEVICE AND METHOD FOR PROVIDING THE SAME

(71) Applicant: General Electric Company, Schenectady, NY (US)

(72) Inventors: Stephen Daley Arthur, Niskayuna, NY (US); Kevin Sean Matocha, Starkville, MS (US); Ramakrishna Rao, Niskayuna, NY (US); Peter Losee, Starkville, MS (US); Alexander Viktorovich Bolotnikov, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 40 days.

(21) Appl. No.: 13/712,188

(22) Filed: Dec. 12, 2012

(65) Prior Publication Data

US 2014/0159141 A1     Jun. 12, 2014

(51) Int. Cl.
*H01L 29/66*     (2006.01)
*H01L 29/78*     (2006.01)
(Continued)

(52) U.S. Cl.
CPC ...... *H01L 29/7802* (2013.01); *H01L 29/42368* (2013.01); *H01L 29/66068* (2013.01); *H01L 29/66712* (2013.01); *H01L 29/1608* (2013.01)

(58) Field of Classification Search
CPC .......... H01L 29/42368; H01L 29/66068; H01L 29/66712; H01L 29/7802; H01L 29/1608
USPC .......... 257/329, 262, 350, 395; 438/197, 268, 438/981
See application file for complete search history.

(56) References Cited

U.S. PATENT DOCUMENTS 4,448,400 A * 5/1984 Harari .................. 365/185.03
5,422,288 A     6/1995 Neilson et al.
(Continued)

FOREIGN PATENT DOCUMENTS

| EP | 1096573 | 5/2001 |
|---|---|---|
| EP | 1918986 A2 | 5/2008 |
| JP | 2009032919 A | 2/2009 |

OTHER PUBLICATIONS

Matin, Maherin, et al., "A Self-Aligned Process for High-Voltage, Short-Channel Vertical DMOSFETs in 4H-SiC", Purdue University Purdue e-Pub, IEEE Transactions on Electron Devices, Oct. 8, 2004, pp. 1721-1725, vol. 51, Issue 10.

(Continued)

*Primary Examiner* — Michelle Mandala
(74) *Attorney, Agent, or Firm* — Robert M. McCarthy

(57) ABSTRACT

An insulating gate field effect transistor (IGFET) device includes a semiconductor body and a gate oxide. The semiconductor body includes a first well region doped with a first type of dopant and a second well region that is doped with an oppositely charged second type of dopant and is located within the first well region. The gate oxide includes an outer section and an interior section having different thickness dimensions. The outer section is disposed over the first well region and the second well region of the semiconductor body. The interior section is disposed over a junction gate field effect transistor region of the semiconductor body. The semiconductor body is configured to form a conductive channel through the second well region and the junction gate field effect transistor region when a gate signal is applied to a gate contact disposed on the gate oxide.

23 Claims, 29 Drawing Sheets

(51) Int. Cl.
*H01L 29/423* (2006.01)
*H01L 29/16* (2006.01)

(56) References Cited

U.S. PATENT DOCUMENTS

| | | | |
|---|---|---|---|
| 5,879,994 A | 3/1999 | Kwan et al. | |
| 5,894,150 A | 4/1999 | Hshieh | |
| 6,048,759 A * | 4/2000 | Hshieh et al. | 438/206 |
| 6,054,352 A | 4/2000 | Ueno | |
| 6,639,273 B1 | 10/2003 | Ueno | |
| 6,870,221 B2 * | 3/2005 | Venkatraman | 257/341 |
| 6,956,238 B2 | 10/2005 | Ryu et al. | |
| 6,995,397 B2 | 2/2006 | Yamashita et al. | |
| 7,205,629 B2 | 4/2007 | Singh | |
| 7,285,465 B2 | 10/2007 | Tarui et al. | |
| 7,291,521 B2 | 11/2007 | Orlowski et al. | |
| 7,459,752 B2 | 12/2008 | Doris et al. | |
| 7,504,676 B2 | 3/2009 | Bhalla | |
| 8,163,618 B2 | 4/2012 | Bhalla et al. | |
| 2004/0108547 A1 | 6/2004 | Venkatraman | |
| 2006/0194400 A1 * | 8/2006 | Cooper et al. | 438/309 |
| 2012/0132912 A1 | 5/2012 | Suekawa et al. | |
| 2012/0132926 A1 * | 5/2012 | Nakano et al. | 257/77 |

OTHER PUBLICATIONS

Dhar, Sarit, et al., "A Study on Pre-Oxidation Nitrogen Implantation for the Improvement of Channel Mobility in 4H-SiC MOSFETs", IEEE Transactions on Electron Devices, Jun. 6, 2010, pp. 1195-1200, vol. 57, Issue 6.

Wu, Jian, "Design and Fabrication of 4H Silicon Carbide MOSFETs", Graduate School—New Brunswick Rutgers, Jan. 2009, New Brunswick, New Jersey.

Ueno, Katsunori, et al., "Counter-Doped MOSFETs of 4H-SiC", IEEE Electron Device Letters, Dec. 1999, pp. 624-626, vol. 20, Issue 12.

PCT Search Report and Written Opinion dated Mar. 3, 2014 issued in connection with corresponding PCT Patent Application No. PCT/US2013/070522.

Proceeding of the 6$^{th}$ Int'l Symposium on Semiconductor Power Devices and IC's, (ISPSD), May 31-Jun. 2, 1994, Naresh Thapar and B. J. Baliga, "A comparison of high-frequency cell designs for high-voltage DMOSFETs" p. 131-135.

Daisuke Ueda, Hiromi Takagi, and Gota Kano, "A New Vertical Power MOSFET Structure with Extremely Reduced On-Resistance", IEEE Transactions on Electron Devices, vol. ED-32, No. 1, Jan. 1985 p. 2-6.

* cited by examiner

INSULATING GATE FIELD EFFECT TRANSISTOR DEVICE AND METHOD FOR PROVIDING THE SAME

BACKGROUND

Metal-oxide-semiconductor field effect transistor (MOSFET) devices are used to switch the flow of current in a circuit between conducting and non-conducting states. The MOSFET devices include doped source and drain regions in a semiconductor with a gate oxide disposed over the semiconductor between the source and drain regions. The source regions are disposed within larger doped well regions with the source region being doped with an oppositely charged dopant than the well region. A gate contact is disposed over the gate oxide and separated from the semiconductor by the gate oxide. An electronic signal is applied to the gate contact to create a conductive path through the semiconductor from the source to the drain regions. When the signal is removed from the gate contact, the conductive path is no longer present and the semiconductor prevents current from flowing through the semiconductor.

The semiconductor of the MOSFET device may be associated with an on-resistance characteristic that represents the electrical resistance of the MOSFET device to switching from a non-conducting state to the conducting state. This on-resistance characteristic can be reduced in order to decrease power dissipation losses of the MOSFET device. However, decreasing the on-resistance characteristic may be accomplished by reducing the FET channel, connecting source to drain, which can lead to punch through breakdown. Additionally, punch through may result in an increase in the output conductance of the MOSFET device and a decrease in an upper limit on the operating voltage of the MOSFET device.

In order to reduce the potential for punch through to occur, the dopant concentration of the well regions in the semiconductor may be increased. However, such an increase in the dopant concentration can result in an increase in the voltage needed in the signal applied to the gate contact to switch the MOSFET device from the non-conducting state to the conducting state. During the non-conducting state, the gate will be biased below the threshold value required for channel conduction and is usually at the same potential as the source or below (e.g. a negative gate bias value for an N-channel FET). When the device is in its full blocking state, the depletion charge on the lightly doped side of the blocking junction creates an electric field which penetrates the separations in the blocking junction to the interface, and will terminate on the gate electrode. The ratio of dielectric constants between the semiconductor and the gate oxide will amplify the electric field strength component normal to the surface [e.g. $E_{ox}=(\epsilon_{SiC}/\epsilon_{ox})*E_{SiC}$], by the ratios of the relative permittivities. For the case of a SiC and silicon oxide interface, the normal field is enhanced by a factor 2.5 in the oxide. As the electric fields generated in the gate oxide increase, the reliability and/or useful life of the MOSFET device can decrease due to breakdown in the gate oxide material. Thus it is desirable to reduce the field strength in the gate oxide which covers the spaces between the blocking junctions, commensurate with proper FET operation in the conducting channel.

BRIEF DESCRIPTION

In one embodiment, an insulating gate field effect transistor (IGFET) device is provided that includes a semiconductor body and a gate oxide. The semiconductor body is conductively coupled with a source contact and a drain contact. The semiconductor body includes a first well region comprising a first volume of the semiconductor body that is disposed at a first side of the semiconductor body and that is doped with a first type of dopant. The semiconductor body also includes a second well region comprising a second volume of the semiconductor body that is disposed at the first side of the semiconductor body and that is doped with an oppositely charged second type of dopant. The second well region is disposed within the first well region. The gate oxide is coupled with the semiconductor body and with a gate contact. The gate oxide includes an outer section and an interior section having different thickness dimensions. The outer section is disposed over the first well region and the second well region of the semiconductor body. The interior section is disposed over a junction gate field effect transistor region of the semiconductor body. The semiconductor body is configured to form a conductive channel from the source contact to the drain contact through the second well region and the junction gate field effect transistor region when a gate signal is applied to the gate contact.

In another embodiment, a method is provided that includes doping a semiconductor body with a first type of dopant in a first volume of the semiconductor body to form a first well region and doping the semiconductor body with an oppositely charged second type of dopant in a second volume of the semiconductor body to form a second well region. The second well region is disposed within the first well region. The method also includes providing a gate oxide on the semiconductor body. The gate oxide includes an outer section with thickness equal to or thicker than the interior section. The outer section is disposed over the first well region and the second well region of the semiconductor body. The interior section is disposed over a junction gate field effect transistor region of the semiconductor body. The method further includes conductively coupling a source contact with at least one of the first well region or the second well region of the semiconductor body, a drain contact with the semiconductor body, and a gate contact with the gate oxide. The semiconductor body is configured to form a conductive channel from the source contact to the drain contact through the second well region and the junction gate field effect transistor region when a gate signal is applied to the gate contact.

In another embodiment, another IGFET device is provided that includes a semiconductor body and a gate oxide. The semiconductor body has first well regions doped with a first type of dopant and second well regions doped with an oppositely charged second type of dopant. The second well regions are disposed in the first well regions. The first well regions are separated from each other by a junction gate field effect transistor region of the semiconductor body. The semiconductor body is configured to be conductively coupled with a drain contact and at least one of the first well regions or the second well regions configured to be conductively coupled with a source contact. The gate oxide is disposed over the semiconductor body and is configured to be conductively coupled with a gate contact. The gate oxide has an interior section disposed over the junction gate field effect transistor region of the semiconductor body and outer sections at least partially disposed over the first well regions. The interior section of the gate oxide has a first thickness dimension that is equal to or thicker than the outer section.

BRIEF DESCRIPTION OF THE DRAWINGS

The inventive subject matter will be better understood from reading the following description of non-limiting embodiments, with reference to the attached drawings, wherein below.

DETAILED DESCRIPTION

Figure 1:
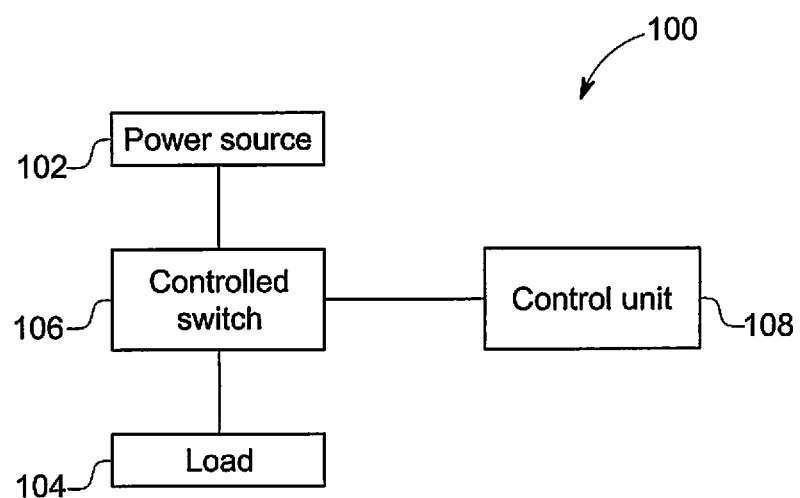
FIG. 1 is a block diagram of one embodiment of a switching system.

Reference will be made below in detail to example embodiments of the inventive subject matter, examples of which are illustrated in the accompanying drawings. Wherever possible, the same reference numerals used throughout the drawings refer to the same or like parts. At least one embodiment described herein provides for a power insulated-gate field-effect transistor (IGFET) device, such as a metal-oxide-semiconductor field-effect transistor (MOSFET), that may be used as or in a switch to control the flow of relatively high currents to one or more loads. While the description herein provides examples of materials that may be used to form the IGFET device, alternatively, one or more other materials may be used.

FIG. 1 is a block diagram of one embodiment of a switching system 100. The switching system 100 may be used to control the flow of electric current from a power source 102 (e.g., power grid, wind turbine, photovoltaic device, battery, and the like) to an electric load 104 (e.g., an electric motor or other device that performs work when electric current is received or stores the electric current for later use). The switching system 100 includes at least one IGFET device 106 ("Controlled Switch" in FIG. 1) that is conductively coupled with the power source 102 and the load 104. The IGFET device 106 is communicatively coupled (e.g., coupled by one or more wired and/or wireless connections) with a control unit 108. The control unit 108 can include a processor, controller, or other logic-based device that automatically switches or is manually controlled to switch the IGFET device 106 between an ON, conducting, or an OFF closed state. The IGFET device 106 is in the ON state to allow the current from the power source 102 to be conducted through the IGFET device 106 to the load 104. The IGFET device 106 is in the OFF state to block the flow of the current through the IGFET device 106 from the power source 102 to the load 104.

Figure 2:
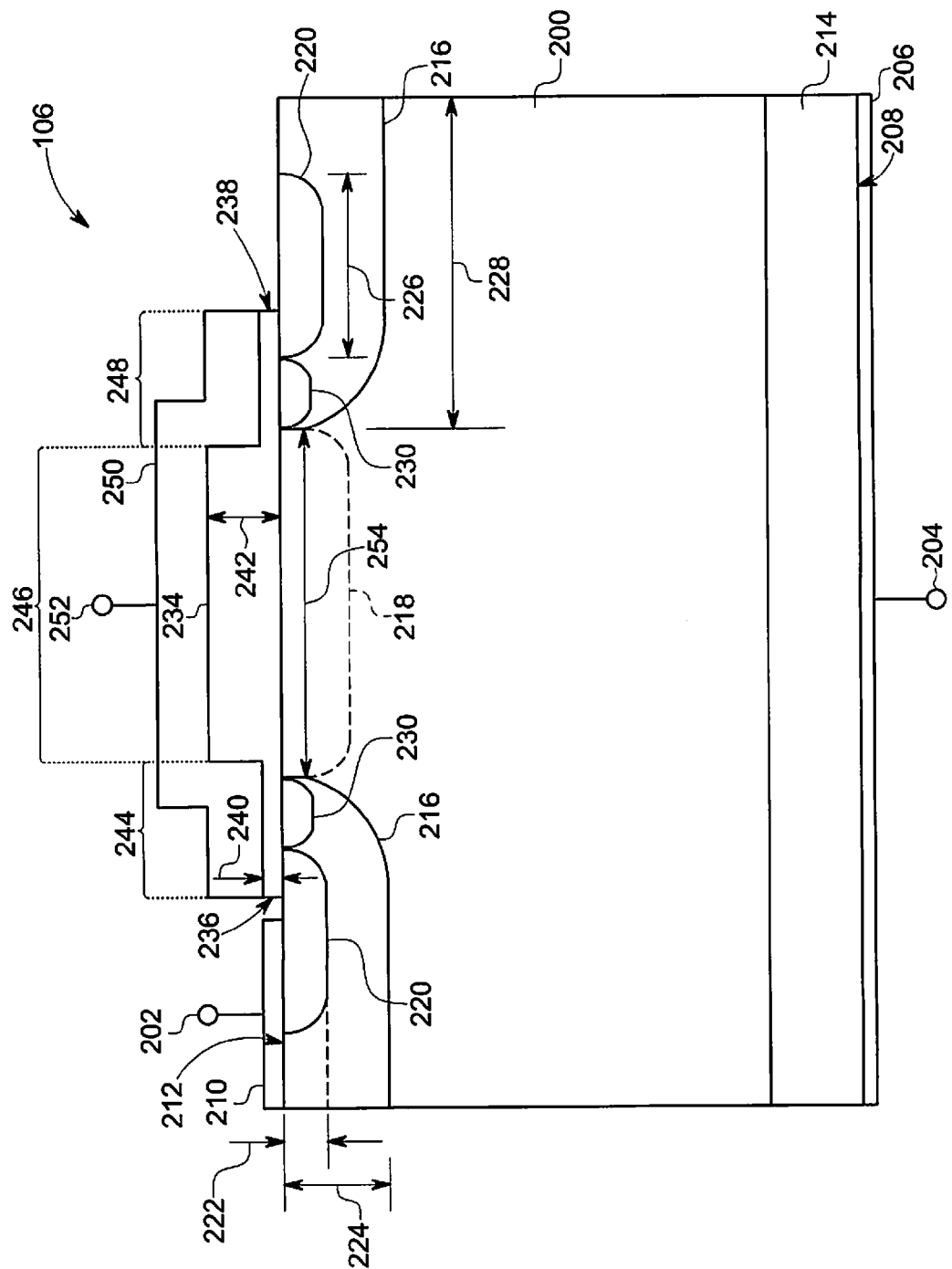
FIG. 2 is a cross-sectional view of one embodiment of an insulating gate field effect transistor (IGFET) device shown in FIG. 1.

FIG. 2 is a cross-sectional view of one embodiment of the IGFET device 106. The IGFET device 106 includes a semiconductor body 200 that is coupled with a conductive source terminal 202 and a conductive drain terminal 204. The source terminal 202 may be conductively coupled with the power source 102 (shown in FIG. 1) and the drain terminal 204 may be conductively coupled with the load 104 (shown in FIG. 1). In the illustrated embodiment, a conductive drain contact 206 is disposed along a bottom side 208 of the semiconductor body 200 with the drain terminal 204 conductively coupled with the contact 206. The source terminal 202 may be conductively coupled with a conductive source contact 210 disposed on a top side 212 of the semiconductor body 200 with the source terminal 202 conductively coupled with the source contact 210. The source contact 210 may be formed from or include one or more conductive materials, such as metals, metal alloys, polysilicon, and the like.

The semiconductor body 200 may include, or be formed from, a doped semiconductor material, such as silicon carbide (SiC) that is doped with an n-type dopant (e.g., nitrogen or phosphorus). The semiconductor body 200 may be relatively lightly doped so that the semiconductor body 200 is an n– material. Alternatively, the semiconductor body 200 may be more heavily doped and/or may be doped with a p-type dopant (e.g., aluminum or boron). In another embodiment, the semiconductor body 200 is formed from another type of semiconductor material.

In the illustrated embodiment, the semiconductor body 200 has a doped layer 214 along the bottom side 208 of the semiconductor body 200. The doped layer 214 may be doped with the same type of dopant as the semiconductor body 200 (e.g., an n-type dopant) and/or may be more heavily doped than the semiconductor body 200 (e.g., an n+ material).

The semiconductor body 200 includes doped first well regions 216 that represent volumes of the semiconductor body 200 that are doped with a different type (e.g., oppositely charged) of dopant than the semiconductor body 200. For example, the first well regions 216 may be doped with a p-type dopant. As shown in FIG. 2, the first well regions 216 may be disposed within the semiconductor body 200 such that the first well regions 216 include less than the entire semiconductor body 200 and the semiconductor body 216 is significantly larger (e.g., in volume) than the first well regions 216.

In one embodiment, the first well regions 216 are heavily doped relative to the semiconductor body 200 (e.g., the first well regions 216 may be p+ doped volumes). The first well regions 216 are laterally spaced apart from each other and separated from each other by a separation region 218 of the semiconductor body 200. The separation region 218 may be referred to as a junction gate field-effect transistor (JFET) region. The separation region 218 can have a width dimension 254 that laterally extends in the semiconductor body 200 from one of the first well regions 216 to the other first well region 216 shown in FIG. 2.

The semiconductor body 200 includes doped second well regions 220 that represent volumes of the semiconductor body 200 that are doped with a different type (e.g., oppositely charged) of dopant than the first well regions 216. For example, the second well regions 220 may be doped with an n-type dopant. In one embodiment, the second well regions 220 are more heavily doped than the semiconductor body 200 (e.g., the second well regions 220 may be n+ doped volumes).

As shown in FIG. 2, the second well regions 220 may be disposed within the first well regions 216 of the semiconductor body 200 such that the second well regions 220 include less than the entire first well regions 216 and are enclosed within the first well regions 216. The second well regions 220 may extend into the semiconductor body 200 by a depth dimension 222 that is smaller than a depth dimension 224 that the first well regions 216 extend into the semiconductor body 200 from the top side 212 of the semiconductor body 200. The second well regions 220 may laterally extend in the semiconductor body 200 by a width dimension 226 that is smaller than a width dimension 228 that the first well regions 216 laterally extend in the semiconductor body 200.

A gate dielectric 234 is disposed on the top side 212 of the semiconductor body 200. The gate dielectric 234 includes, or is formed from, a non-conductive material, such as silicon dioxide or some other material that does not conduct electric current. The gate dielectric 234 laterally extends across the top side 212 of the semiconductor body 200 between opposite ends 236, 238. In the illustrated embodiment, the opposite ends 236, 238 are disposed directly above the first and second well regions 216, 220 such that the gate oxide 234 is a continuous body extending across the separation region 218.

The gate dielectric 234 is staged in thickness dimensions 240, 242 to form different sections 244, 246, 248. The gate oxide 234 may be a continuous body such that the oxide sections 244, 246, 248 are joined with each other and not separated from each other. Outer sections 244, 248 are disposed on opposite sides of an interior oxide section 246. The first outer oxide section 244 extends from the first end 236 to the interior oxide section 246 and the second outer oxide section 248 extends from the second end 238 to the interior oxide section 246. Alternatively, one or more other oxide sections having one or more other thickness dimensions may be provided.

In the illustrated embodiment, the interior oxide section 246 is disposed above the separation region 218 (JFET). For example, the interior oxide section 246 may not extend above the first well regions 216 and may be confined to the area above the separation region 218. The outer oxide sections 244, 248 may be disposed above the first well regions 216 and portions of the second well regions 220. The thickness dimension 242 of the interior oxide section 246 is larger than the thickness dimension 240 of the outer oxide sections 244, 248 in one embodiment. For example, the thickness dimension 240 of the outer oxide sections 244, 248 may be 0.05 microns (or micrometers) or less and the thickness dimension 242 of the interior oxide section 246 may be larger than 0.05 microns. In one embodiment, the thickness dimension 242 may be 0.1 micron or more. In another embodiment, the thickness dimension 242 may be 0.25 micron or more. Alternatively, the thickness dimension 242 may be 0.55 micron or more. The thickness dimension 242 of the interior oxide section 246 can be based on the thickness dimension 240 of the outer oxide sections 244, 248. For example, the thickness dimension 242 may be an integer multiple of the thickness dimension 240, such as 2, 5, 11, or other integer multiple. Alternatively, the thickness dimension 242 may be a non-integer multiple of the thickness dimension 240.

A conductive gate contact 250 is disposed above the gate oxide 234. The gate contact 250 may be formed from or include one or more conductive materials, such as metals, metal alloys, polysilicon, and the like. The gate contact 250 is separated from the semiconductor body 200 by the gate oxide 234. The gate oxide 234 prevents the gate contact 250 from engaging the semiconductor body 200. The gate contact 250 continuously extends across the entire gate oxide 234 in the illustrated embodiment. Alternatively, the gate contact 250 may only extend over a portion of the gate oxide 234. The gate contact 250 is conductively coupled with a conductive gate terminal 252. The gate terminal 252 may be conductively coupled with the control unit 108 (shown in FIG. 1) such that the control unit 108 can control when an electric gate signal is applied to the gate terminal 252, as described below.

In operation, the source terminal 202 can be conductively coupled with the power source 102 (shown in FIG. 1) and the drain terminal 204 can be conductively coupled with the load 104 (shown in FIG. 1). When no gate signal is applied to the gate terminal 252 or a gate signal having a voltage that is lower than the turn on voltage (threshold voltage) of the IGFET device 106 is applied to the gate terminal 252, the IGFET device 106 is in a blocking or nonconductive state. When in the blocking or nonconductive state, no significant current flows through the source terminal 202 and drain terminal 204. The control unit 108 (shown in FIG. 1) can be controlled to apply a gate signal having a voltage that meets or exceeds the threshold voltage of the IGFET device 106 to the gate terminal 252. When such a gate signal is applied, a relatively high concentration of negative charge carriers (such as electrons) in the semiconductor body 200 is attracted toward the FET channel region, the portion of 216 along the semiconductor surface. The negative charge carriers may be attracted from the second well regions 220.

The relatively high concentration of the negative charge carriers forms an inversion layer in the channel region along the surface of the semiconductor body 200 between the first well regions 216 and the second well regions 220. The inversion layer provides a conductive channel in the semiconductor body 200 at or near the interface between the first well surface 216 and the gate dielectric 234. If the gate signal has a sufficiently large voltage, then the conductive channel formed will allow the current applied to the source terminal 202 to flow through the source contact 210 and the semiconductor body 200 (e.g., through the conductive channel) and to the drain terminal 204 through the drain contact 250. When the gate signal is removed, such as by decreasing the voltage of the gate signal below the threshold voltage of the IGFET device 106, the conductive channel is no longer formed and the current may be unable to flow through the semiconductor body 200 to the drain terminal 204. Application of the gate signal can be used to control the flow of the current from the power source 102 (shown in FIG. 1) to the load 104 (shown in FIG. 1) in this way.

In one embodiment, the presence of the doped surface regions 230 alone may not increase the peak electric field at the SiC and $SiO_2$ interface. The doped surface regions 230 can be eliminated and the net concentration in the JFET region in reverse condition may be important, as the peak electric field under the gate oxide (e.g., at the oxide-semiconductor interface) is in the middle of JFET region.

Figure 3:
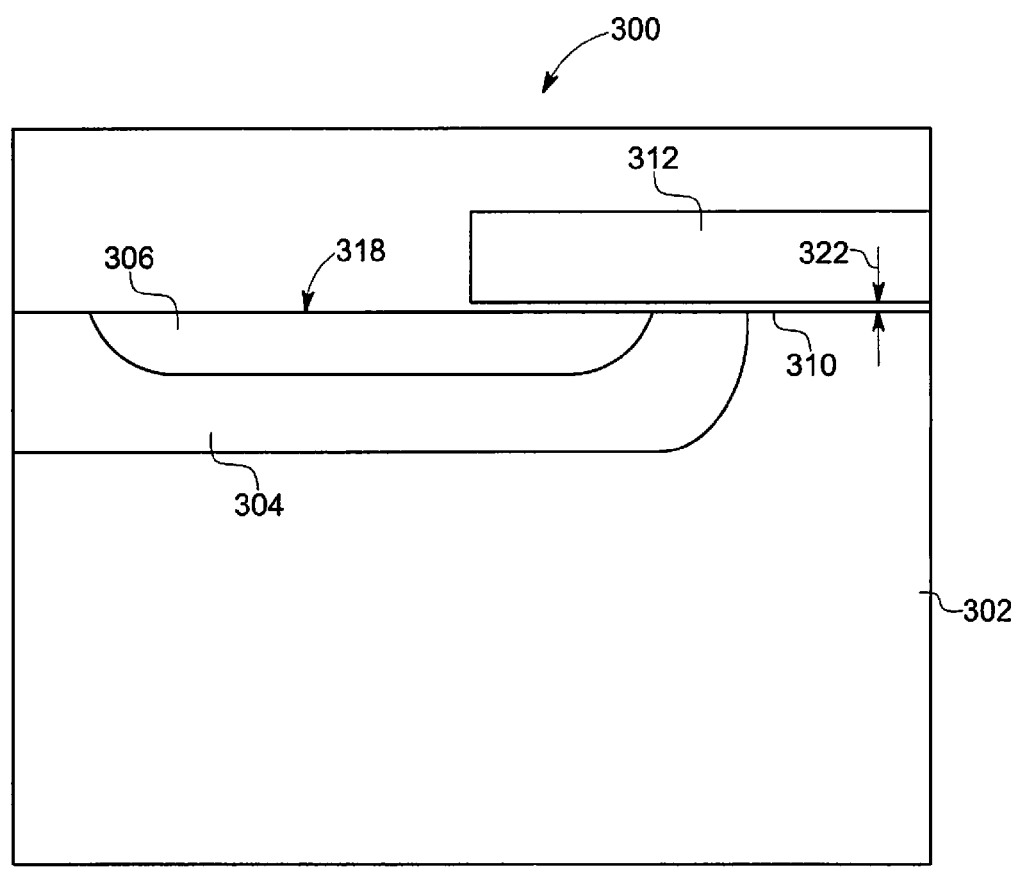
FIG. 3 is a cross-sectional view of an IGFET device in accordance with one example.

FIG. 3 is a cross-sectional view of an IGFET device 300 in accordance with one example. Similar to the IGFET device 106 shown in FIG. 2, the IGFET device 300 includes a semiconductor body 302, a first well region 304, a second well region 306, a gate oxide 310, and a conductive gate contact 250. Only part of the IGFET device 300 is shown in FIG. 3. For example, the IGFET device 300 may also include another first well region 304 and/or second well region 306, and may include a doped layer similar to the layer 214 (shown in FIG. 2), a drain that is similar to the drain 206 (shown in FIG. 2), and a contact similar to the source contact 210 (shown in FIG. 2).

The gate oxide 310 in the IGFET device 300 has a constant thickness dimension 322 of 0.05 microns in the illustrated example. For example, the gate oxide 310 may not have a thicker interior section and thinner outer sections similar to the IGFET device 106 shown in FIG. 2.

Figure 4:
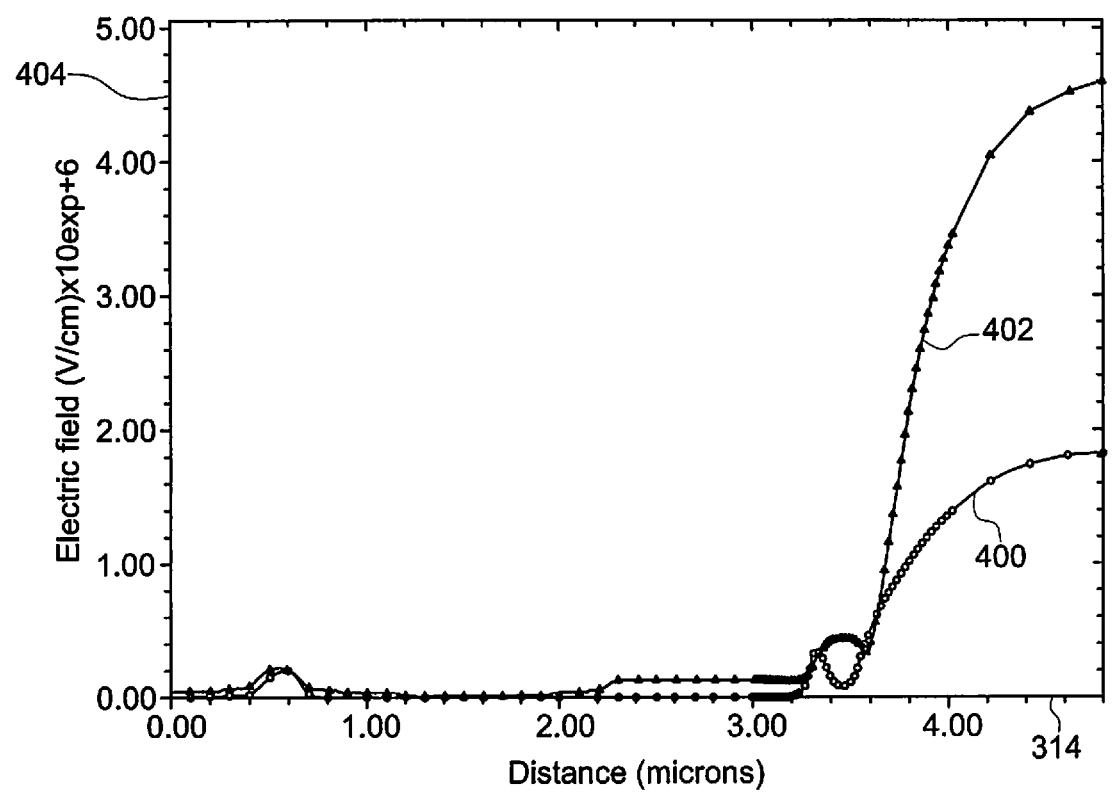
FIG. 4 illustrates relationships between electric fields and locations in the IGFET device shown in FIG. 3.

With continued reference to FIG. 3, FIG. 4 illustrates relationships 400, 402 between electric fields and locations in the IGFET device 300 shown in FIG. 3 with the device operating in the blocking (off) state. The relationships 400, 402 are shown alongside the horizontal axis 314 (representative of lateral distances from the left side of the IGFET device 300) and a vertical axis 404 representative of the magnitude of the electric fields in units of 100,000 volts per centimeter (e.g., $(V/cm^3)*10^6$). A horizontal axis 314 representative of distance from a left side of the IGFET device 300 and a vertical axis 316 representative of distance from a top side 318 of the semiconductor body 302 are shown.

The relationship 400 represents the magnitude of the electric field in the semiconductor body 302 at the different lateral distances of the horizontal axis 314. The relationship 402 represents the magnitude of the electric field in the gate oxide 310 at the different lateral distances of the horizontal axis 314. As shown in FIG. 4, the electric field in the gate oxide 310 is smaller than in the semiconductor body 302 at lateral distances from the left side of the IGFET device 300 up to the interface between the first well region 304 and the remainder of the semiconductor body 302 (e.g., at approximately 3.05 microns). At lateral distances that are greater than this interface, the electric field in the gate oxide 310 is larger. In the model results illustrated the electric field in the gate oxide 402 approaches a value of 4020000 $V/cm^3$ (e.g., at lateral distances of 5.08 microns or more).

Figure 5:
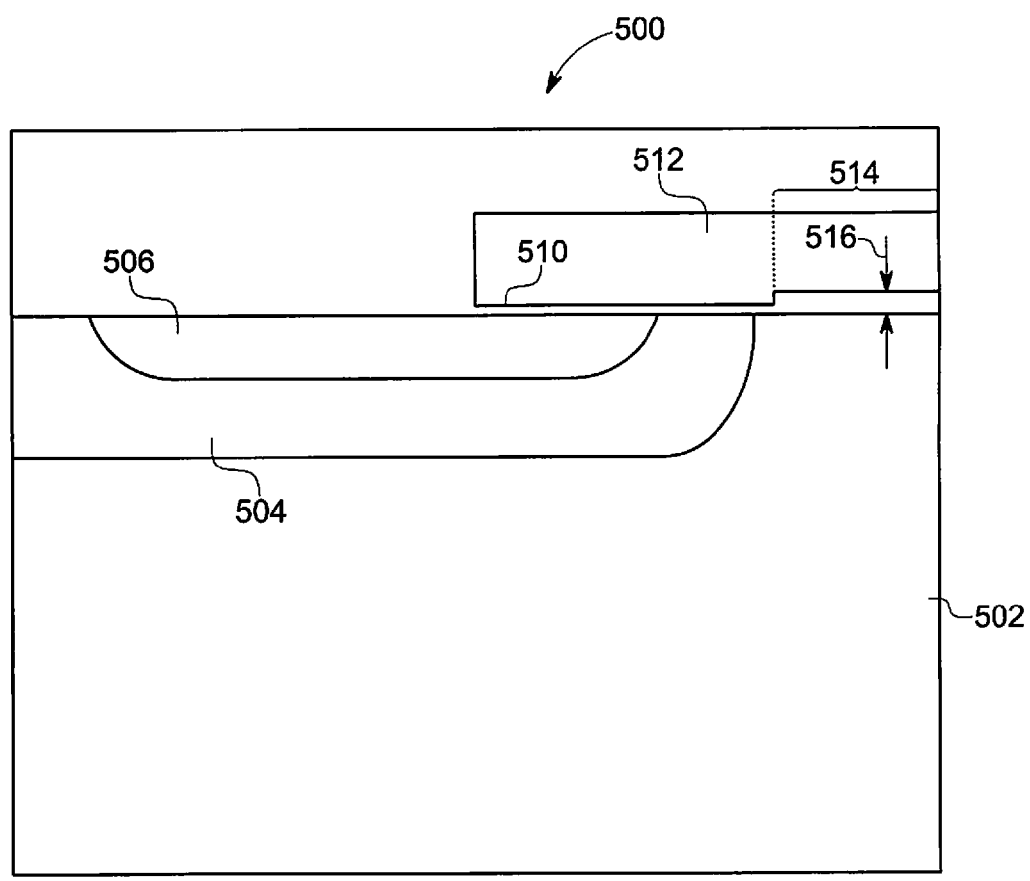
FIG. 5 illustrates a cross-sectional view of an IGFET device in accordance with another example.
Figure 7:
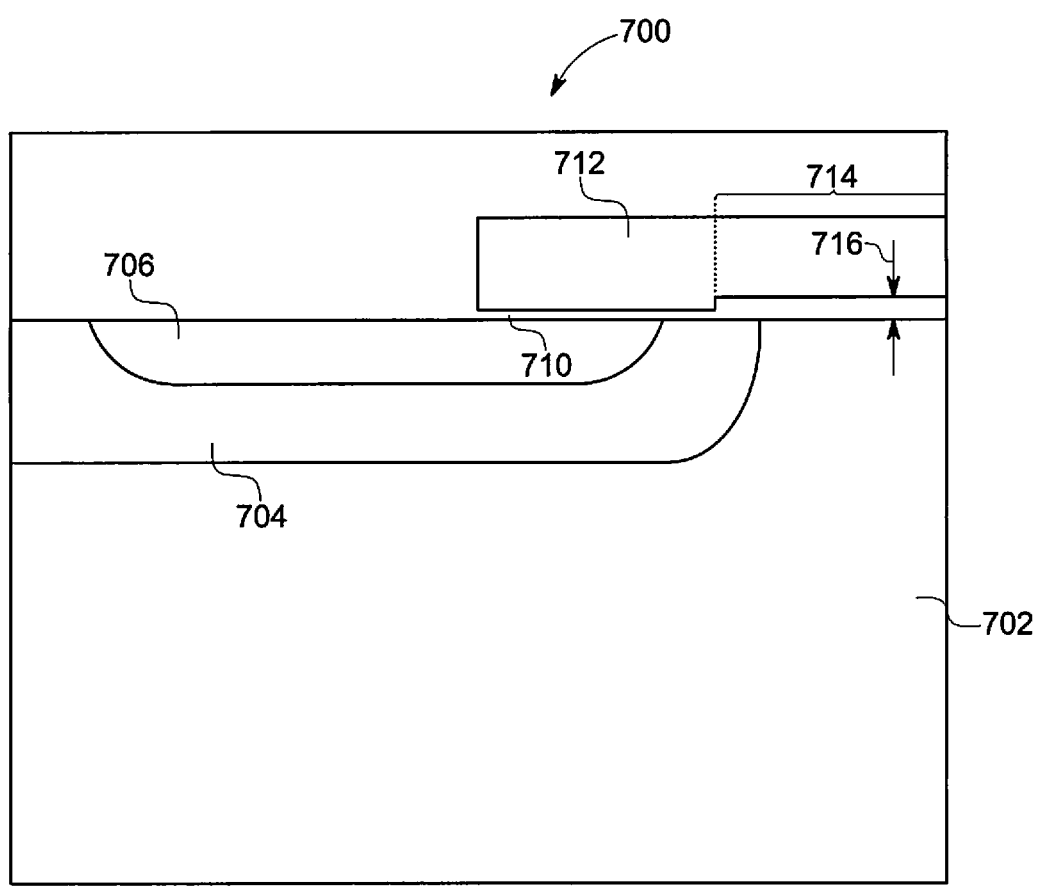
FIG. 7 illustrates a cross-sectional view of an IGFET device in accordance with another example.
Figure 9:
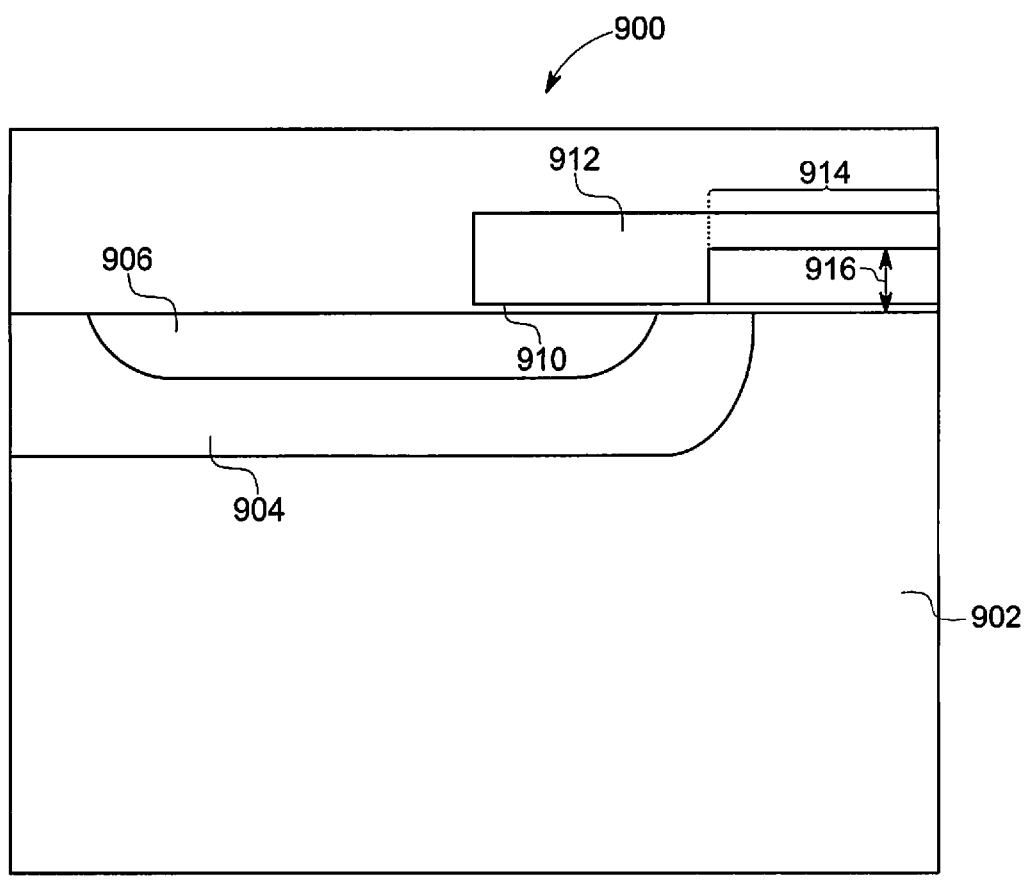
FIG. 9 illustrates a cross-sectional view of an IGFET device in accordance with another example.

FIGS. 5, 7, and 9 illustrate cross-sectional views of IGFET devices 500, 700, 900 in accordance with additional examples. Similar to the IGFET device 106 shown in FIG. 2, the IGFET devices 500, 700, 900 include semiconductor bodies 502, 702, 902, first well regions 504, 704, 904, second well regions 506, 706, 906, gate oxides 510, 710, 910, and conductive contacts 512, 712, 912. Only parts of the IGFET devices 500, 700, 900 are shown in FIGS. 5, 7, and 9. For example, the IGFET devices 500, 700, 900 may also include additional first well regions 504, 704, 904 and/or second well regions 506, 706, 906, and may include doped layers similar to the layer 214 (shown in FIG. 2), cathodes that are similar to the cathode 206 (shown in FIG. 2), and contacts similar to the source contact 210 (shown in FIG. 2).

The gate oxides 510, 710, 910 have shapes that are similar to the gate oxide 234 shown in FIG. 2. For example, the gate oxides 510, 710, 910 have thicker interior sections 514, 714, 914 than other sections (e.g., outer sections) of the gate oxides 510, 710, 910. In the illustrated embodiments, the gate oxides 510, 710, 910 have thickness dimensions 516, 716, 916 in the interior sections 514, 714, 914 of 0.1 microns, 0.25 microns, and 0.55 microns, respectively. Alternatively, other thickness dimensions 516, 716, 916 may be used.

The horizontal axis 314 representative of distance from left sides of the IGFET devices 500, 700, 900 is shown in FIGS. 5, 7, and 9, as well as the vertical axis 316 representative of distance from top sides of the semiconductor bodies 502, 702, 900.

Figure 6:
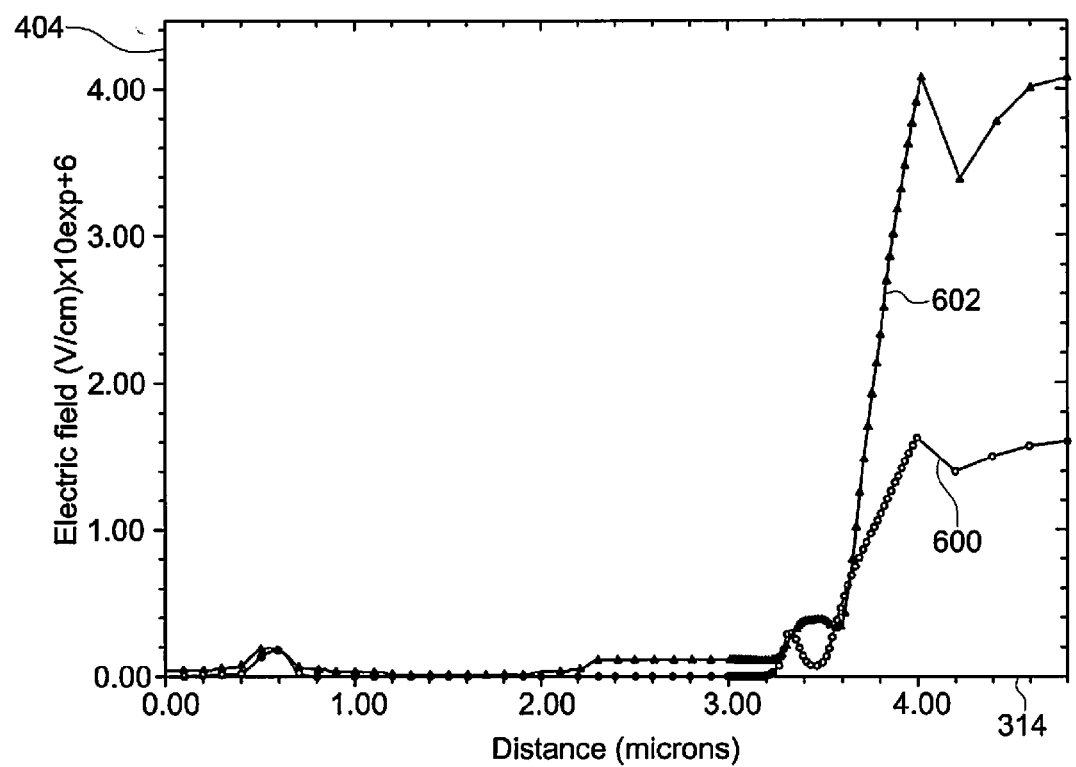
FIG. 6 illustrates a relationship between electric fields and locations in the IGFET device shown in FIG. 5.
Figure 8:
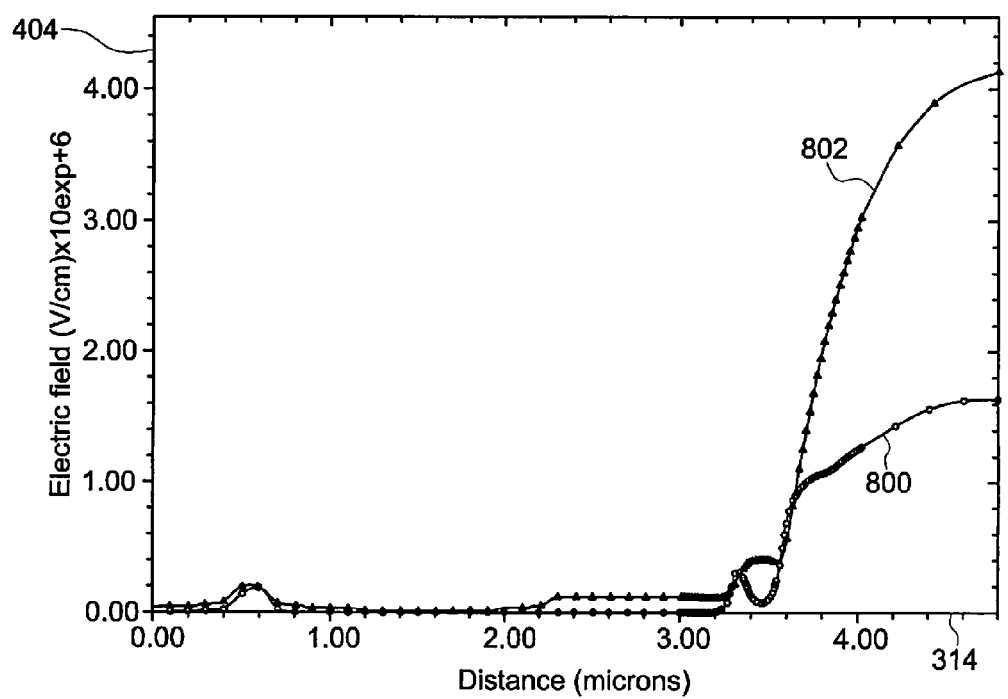
FIG. 8 illustrates a relationship between electric fields and locations in the IGFET device shown in FIG. 7.
Figure 10:
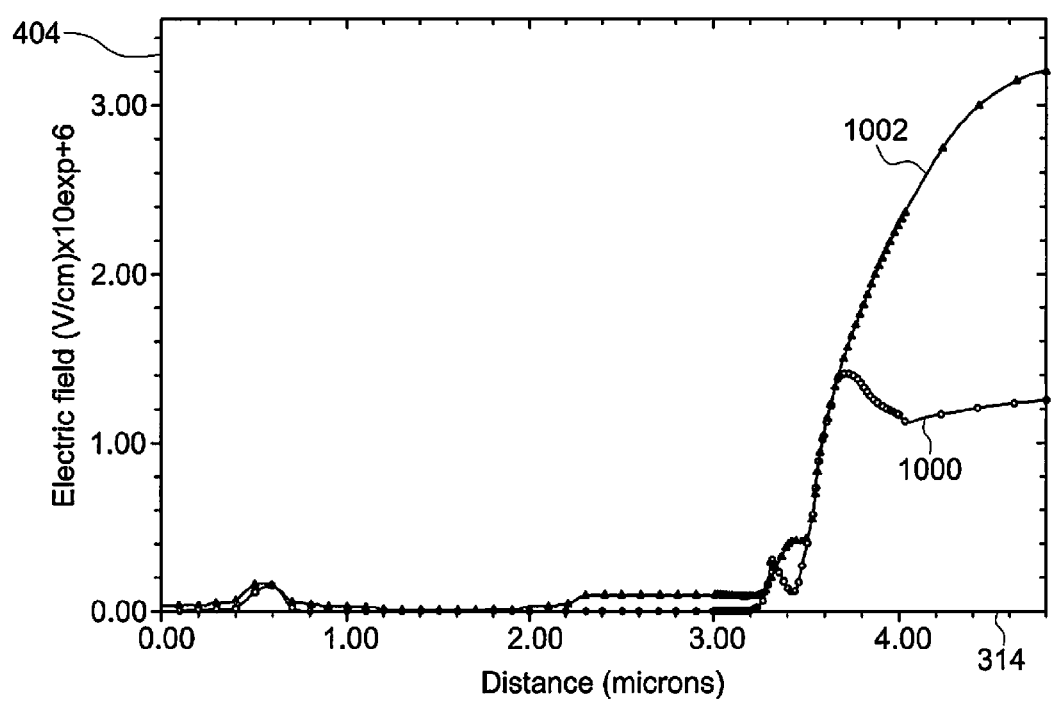
FIG. 10 illustrates a relationship between electric fields and locations in the IGFET device shown in FIG. 9.

With continued reference to FIGS. 5, 7, and 9, FIGS. 6, 8, and 10 illustrate relationship between electric fields and locations in the IGFET devices 500, 700, 900 shown in FIGS. 5, 7, and 9, respectively. For example, FIG. 6 illustrates relationships 600, 602 for the IGFET device 500, FIG. 8 illustrates relationships 800, 802 for the IGFET device 700, and FIG. 10 illustrates relationships 1000, 1002 for the IGFET device 900.

The relationships shown in FIGS. 6, 8, and 10 are shown alongside the horizontal axis 314 (representative of lateral distances from the left side of the corresponding IGFET device) and the vertical axis 404 representative of the magnitude of the electric fields in units of 100,000 volts per centimeter (e.g., $(V/cm^3)*10^6$).

The relationships 600, 800, 1000 represent the magnitudes of the electric fields in the semiconductor bodies 502, 702, 902 at the different lateral distances of the horizontal axis 314. The relationships 602, 802, 1002 represent the magnitudes of the electric fields in the gate oxides 510, 710, 910 at the different lateral distances of the horizontal axis 314. As shown in FIGS. 4, 6, 8, and 10, the electric fields in the gate oxides 310, 510, 710, 910 decrease with increasing thickness dimensions of the interior sections of the gate oxides. The electric field in the gate oxide 310 approaches a value of 4,020,000 $V/cm^3$, the electric field in the gate oxide 510 approaches a value of 4,000,000 $V/cm^3$, the electric field in the gate oxide 710 approaches a value of 3,040,000 $V/cm^3$, and the electric field in the gate oxide 910 approaches a value of just over 2,250,000 $V/cm^3$.

As described above, the thickness dimensions 322, 516, 716, 916 associated with the interior sections of the gate oxides 310, 510, 710, 910 are 0.05 microns, 0.1 microns, 0.25 microns, and 0.55 microns, respectively. Other decreases in the electric fields within the gate oxides may be realized with other thickness dimensions of the interior section. For example, a thickness dimension for the interior section of a gate oxide may be increased to 0.4 microns such that the electric field in the gate oxide approaches a value of 3,750, 000 V/cm³. Therefore, in one embodiment, increasing the thickness dimension of the interior section of a gate oxide in the IGFET device can result in decreasing electric fields in the gate oxide when the dopant concentration in the first well regions are increased and/or the doped surface region is provided in the IGFET device relative to conventional IGFET devices, as described above. Also as described above, reducing the electric fields in the gate oxide can increase the useful life or life span of the IGFET device.

FIGS. 12 through 16 show the effect of increasingly thicker oxides over the JFET region on oxide electric field at 6.5 kV. FIGS. 12A, 13A, 14A, 15A, and 16A show cross-sectional views of different embodiments of the IGFET devices having different oxide thicknesses ($t_{JFET\_OX}$) over the JFET region. FIGS. 12B, 13B, 14B, 15B, and 16B show the electric fields along the SiC—SiO$_2$ interfaces of the devices shown in the corresponding FIGS. 12A, 13A, 14A, 15A, and 16A. The oxide thickness over the JFET region in FIG. 12A is 0.05 µm, 0.1 µm in FIG. 13A, 0.15 µm in FIG. 14A, 0.25 µm in FIG. 15A, and 0.55 µm in FIG. 16A. Thicker oxides reduce the center electric field, but at the expense of the electric field at the transition edge between the thinner oxide portion and the thicker oxide portion.

FIGS. 17 through 20 show the effect of oxide taper angles and oxide thickness, while keeping the electric field below 4.0 Mv/cm. FIGS. 17A, 18A, 19A, and 20A show cross-sectional views of different embodiments of the IGFET devices having different oxide taper angles. The oxide thickness ($t_{JFET\_OX}$) over the JFET region is 0.55 µm in FIGS. 17A, 18A, and 19A and is 0.2 µm in FIG. 20A. The oxide taper angle is approximately 90 degrees in FIG. 17A, approximately 45 degrees in FIGS. 18A and 20A, and is approximately 17 degrees in FIG. 19A. In another embodiment, the oxide taper angle may be between 75 and 105 degrees, between 30 and 50 degrees, or between 10 and 30 degrees.

Figure 18A:
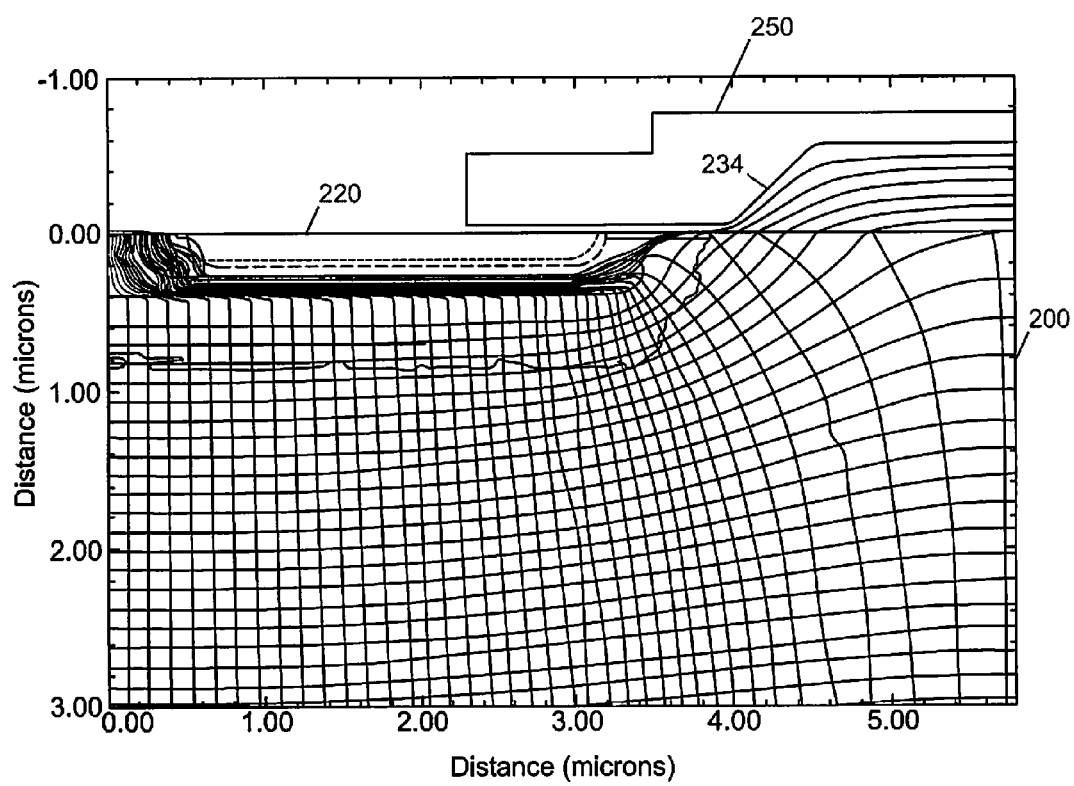
FIG. 18A illustrates a cross-sectional view of an IGFET device having an oxide thickness over a JFET region of 0.55 µm and an oxide taper angle of 45 degrees in accordance with one embodiment.
Figure 18B:
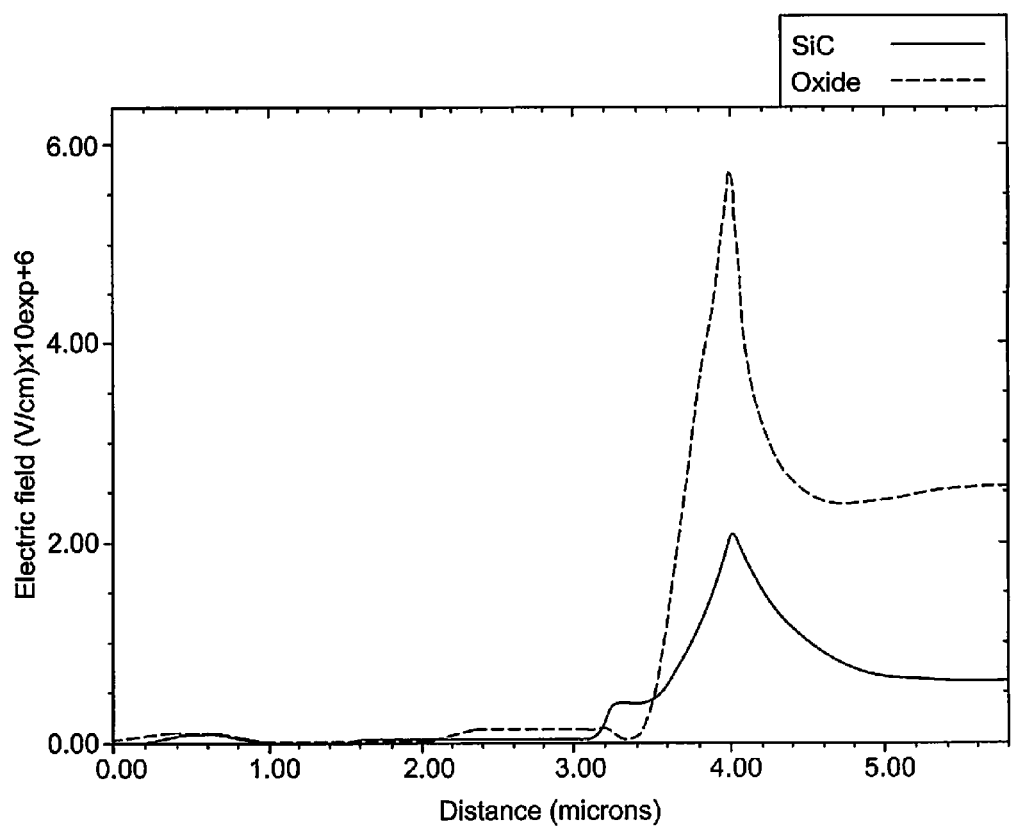
FIG. 18B illustrates an electric field along an SiC—SiO$_2$ interface of the device shown in FIG. 18A.

FIGS. 17B, 18B, 19B, and 20B show the electric fields along the SiC—SiO$_2$ interfaces of the devices shown in the corresponding FIGS. 17A, 18A, 19A, and 20A. In one embodiment, FIGS. 18A and 18B show further optimization of thickness and taper angles of the oxide, with a 6 degree taper providing an improved solution in one embodiment.

The electric field in SiO$_2$ can be effectively reduced by increasing the thickness of oxide above JFET region up to 0.5 µm as shown in FIGS. 12 through 16, while not compromising the on-state resistance of the device by not having any of the thicker portion of the gate oxide over the conduction channel (p-well region). It should be noted, that despite the electric field being decreased below 3 MV/cm in the center of JFET region, its value can increase up to 6 MV/cm near the corner of thick oxide region due to field crowding. This would exceed reliability requirements that the electric field be less than or equal to 4 MV/cm. The additional optimization of oxide thickness indicates that the 0.15 µm of SiO$_2$ provides the same electric field value in the center of JFET region and near the corner of thick oxide region (~3.8 MV/cm).

Figure 19A:
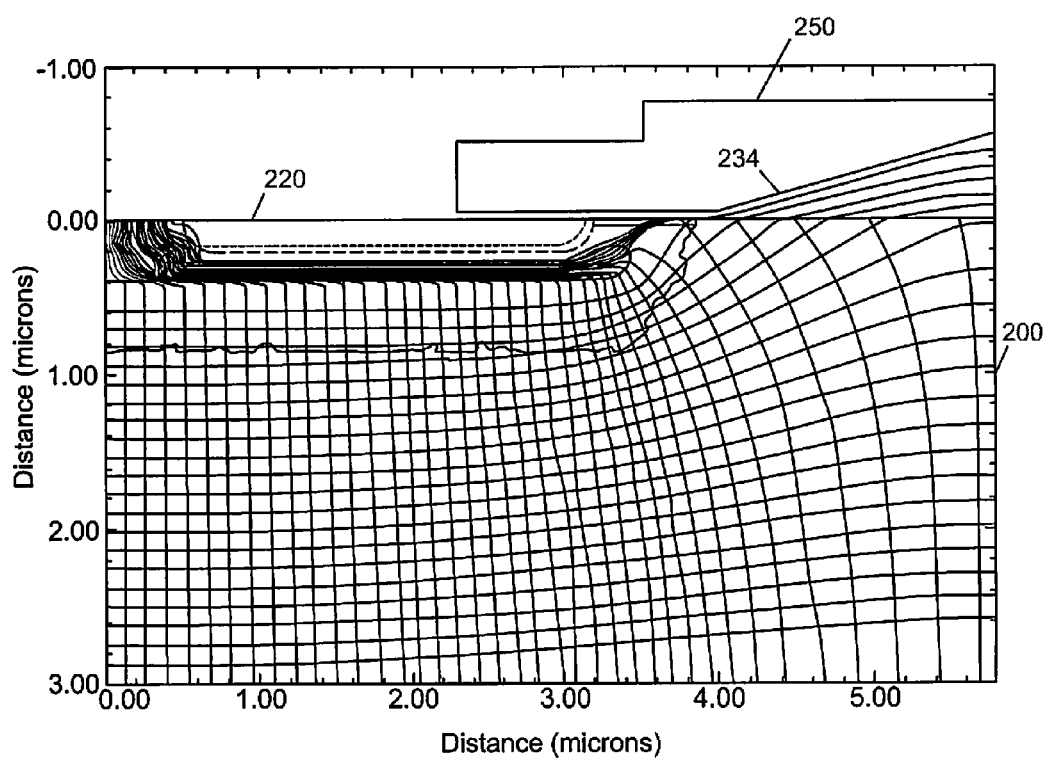
FIG. 19A illustrates a cross-sectional view of an IGFET device having an oxide thickness over a JFET region of 0.55 µm and an oxide taper angle of approximately 17 degrees in accordance with one embodiment.
Figure 19B:
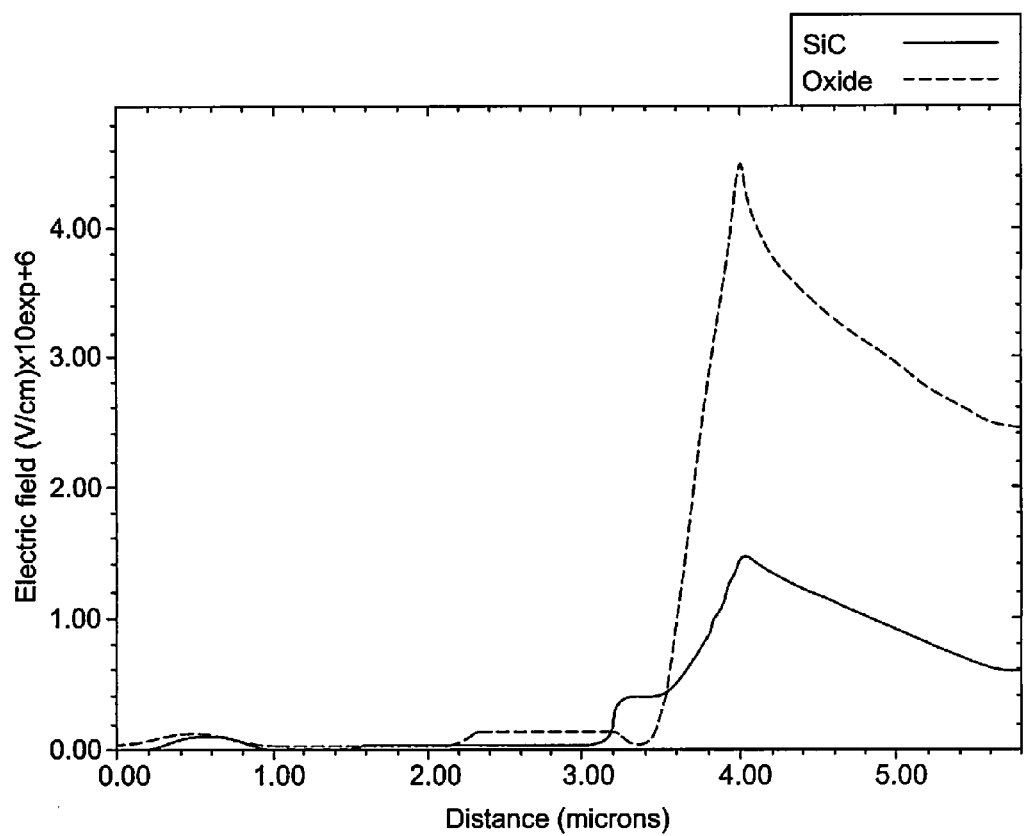
FIG. 19B illustrates an electric field along an SiC—SiO$_2$ interface of the device shown in FIG. 19A.
Figure 20A:
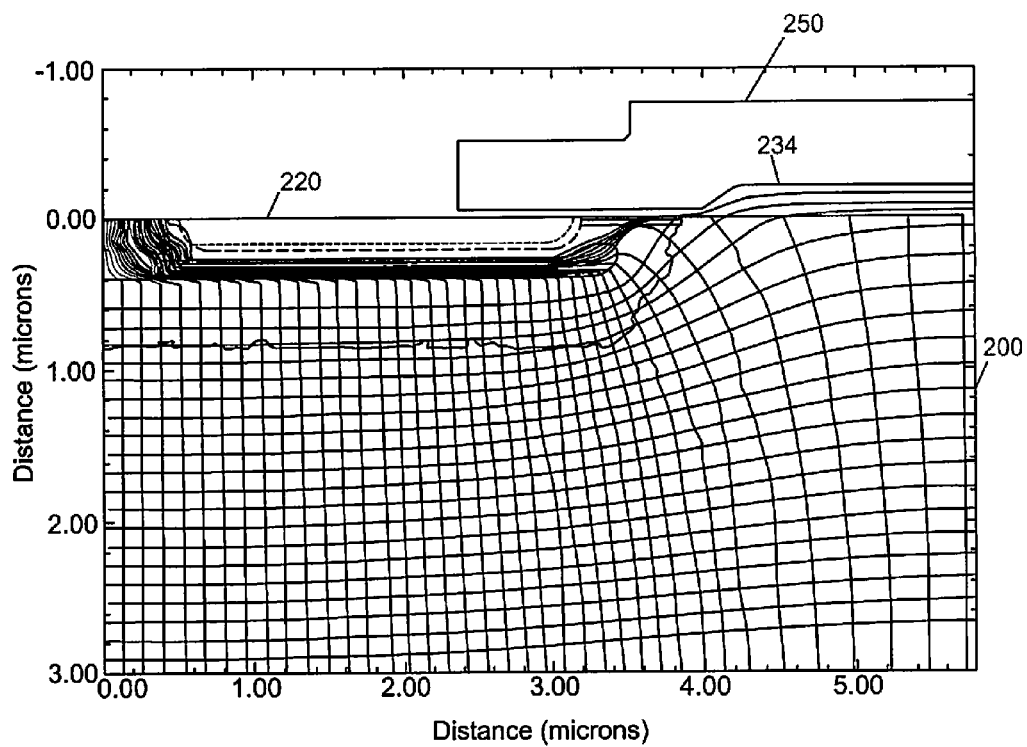
FIG. 20A illustrates a cross-sectional view of an IGFET device having an oxide thickness over a JFET region of 0.2 µm and an oxide taper angle of approximately 45 degrees in accordance with one embodiment.
Figure 20B:
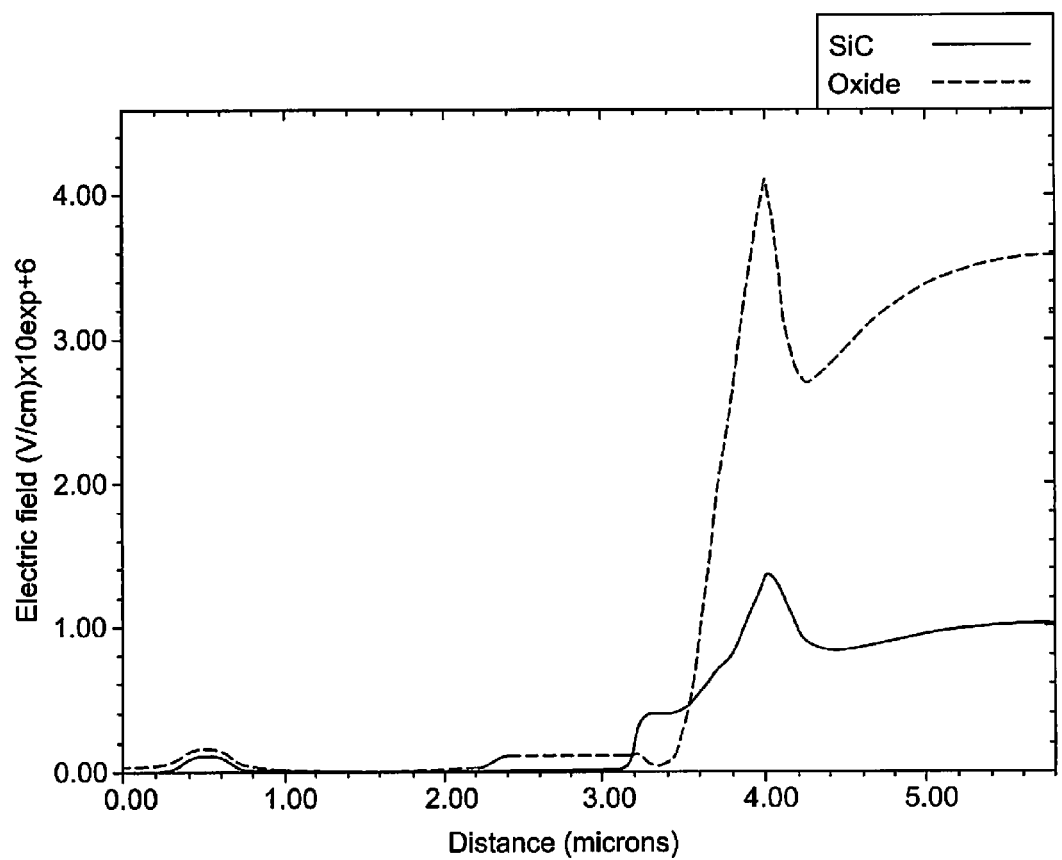
FIG. 20B illustrates an electric field along an SiC—SiO$_2$ interface of the device shown in FIG. 20A.

Additional suppression of electric field near the corner of thick oxide can be obtained by sloping the oxide (e.g., by providing a beveled structure). As shown in FIGS. 19A and 19B, the beveled 0.5 µm oxide having an angle of approximately 17 degrees allows the corner electric field to be reduced from 6 MV/cm to 4.5 MV/cm. Further optimization of the oxide thickness and bevel angle are shown in FIGS. 18A and 18B, where it is shown that bevel angles can reduce the peak JFET electric field, which occurs at the thin to thick oxide transition edge on the non-beveled example. The embodiments shown in FIG. 14 have electric fields of less than 4.0 MV/cm.

Figure 11:
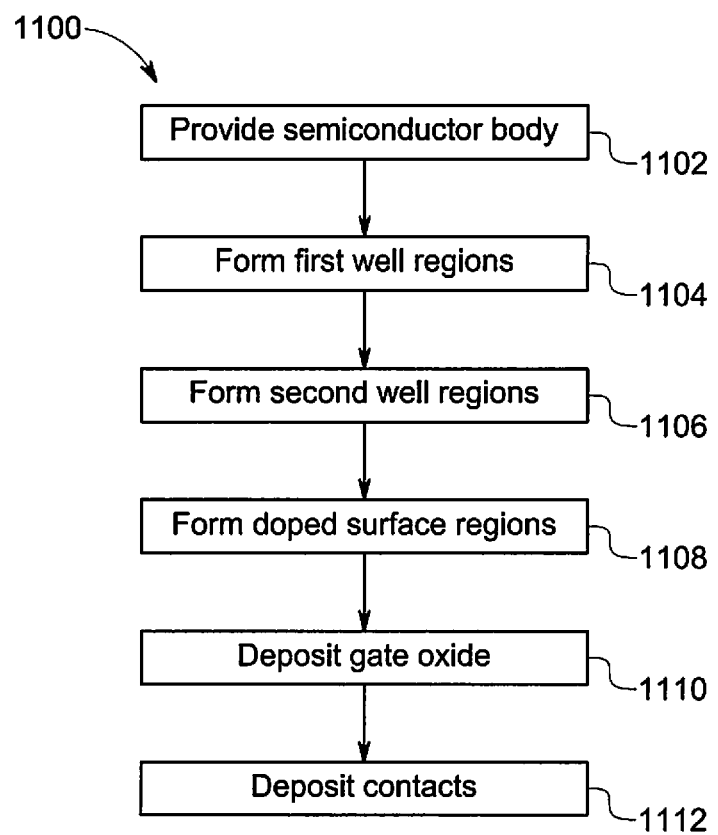
FIG. 11 is a flowchart of one embodiment of a method for providing an IGFET device.
Figure 12A:
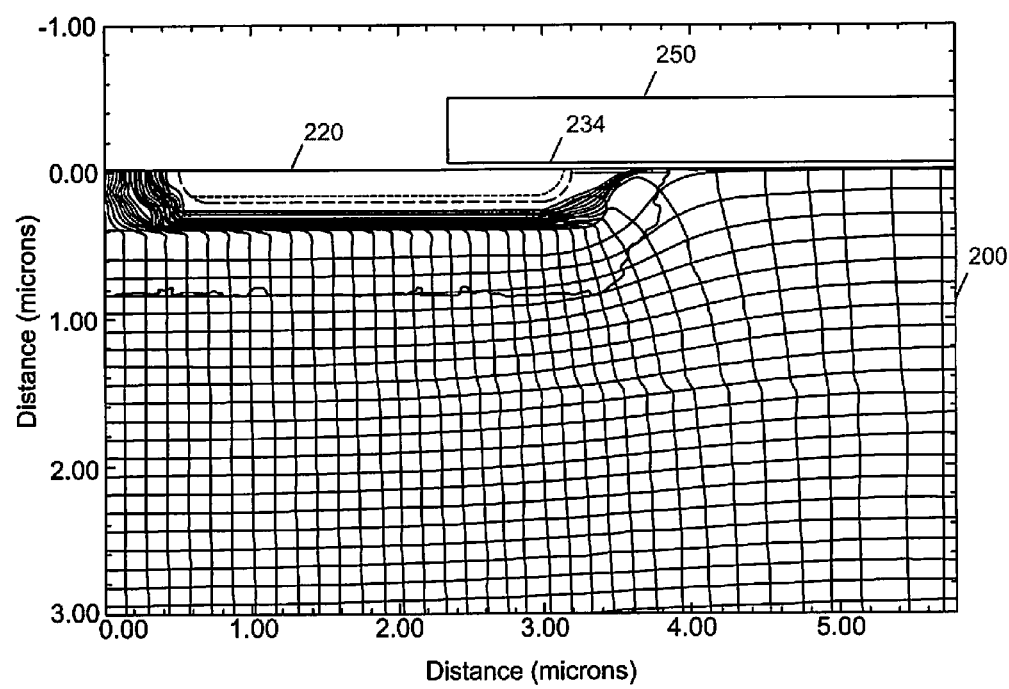
FIG. 12A illustrates a cross-sectional view of an IGFET device having an oxide thickness over a JFET region of 0.05 µm in accordance with one embodiment.
Figure 12B:
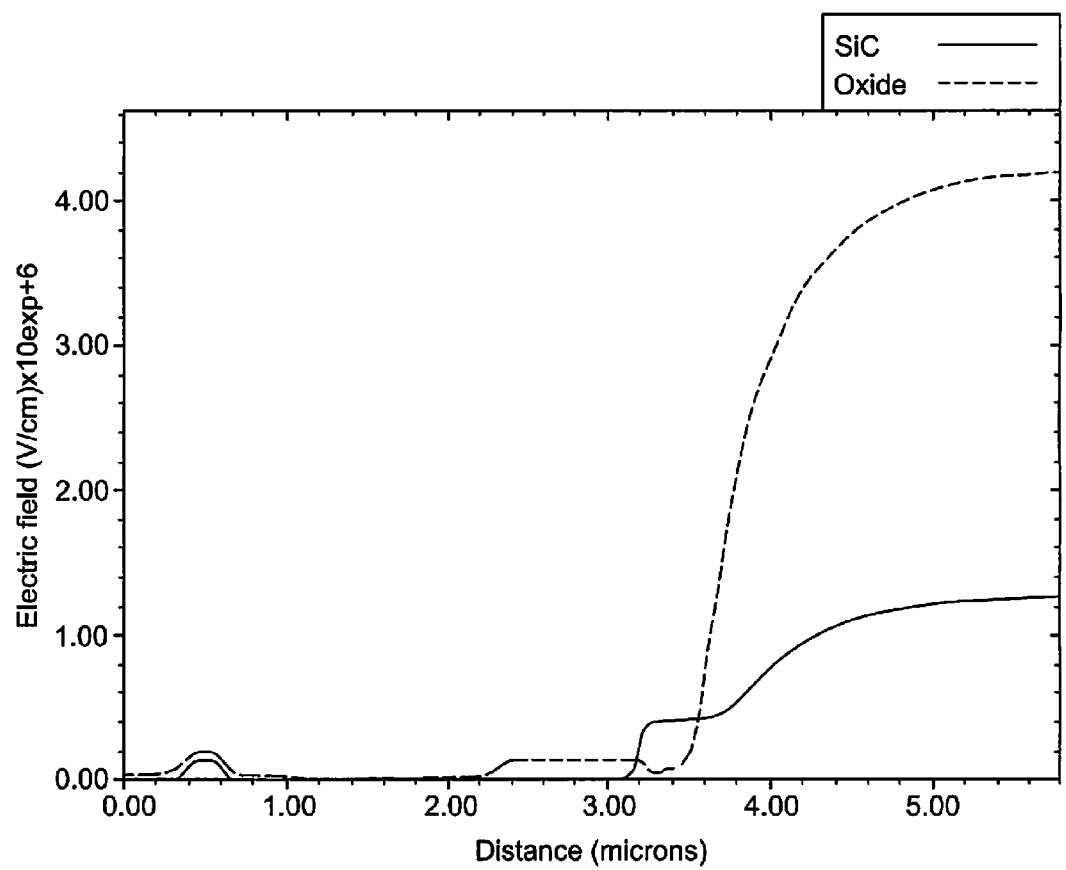
FIG. 12B illustrates an electric field along an SiC—SiO$_2$ interface of the device shown in FIG. 12A.
Figure 13A:
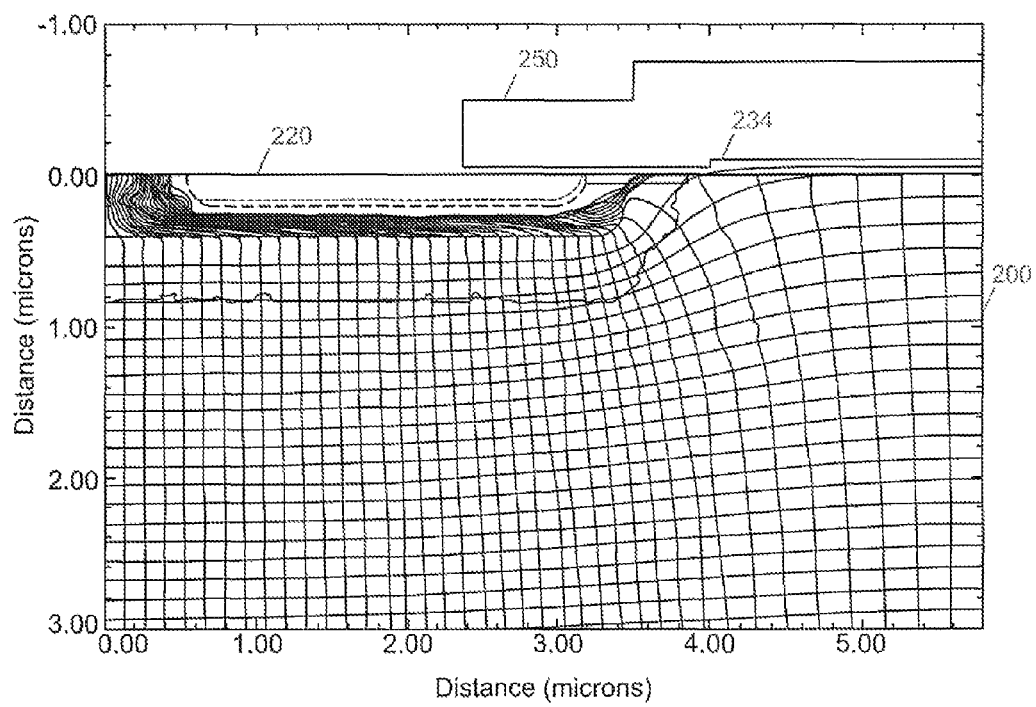
FIG. 13A illustrates a cross-sectional view of an IGFET device having an oxide thickness over a JFET region of 0.1 µm in accordance with one embodiment.
Figure 13B:
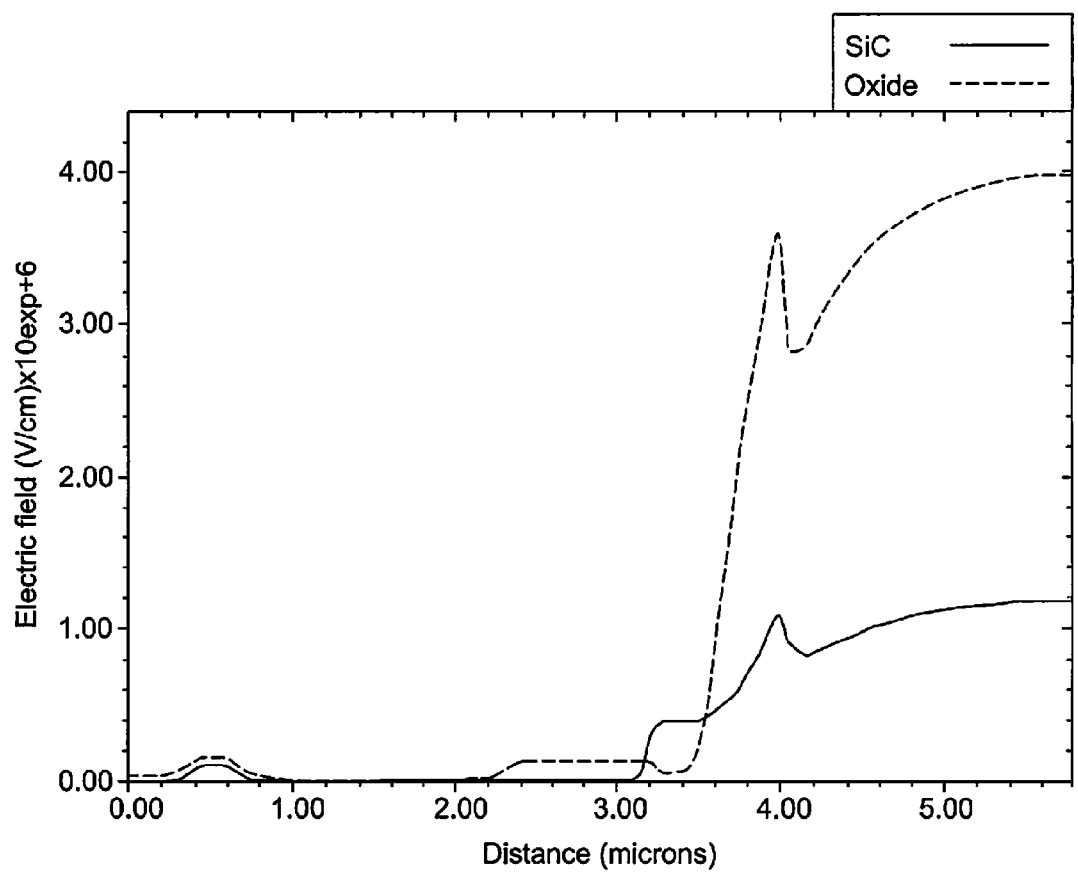
FIG. 13B illustrates an electric field along an SiC—SiO$_2$ interface of the device shown in FIG. 13A.
Figure 14A:
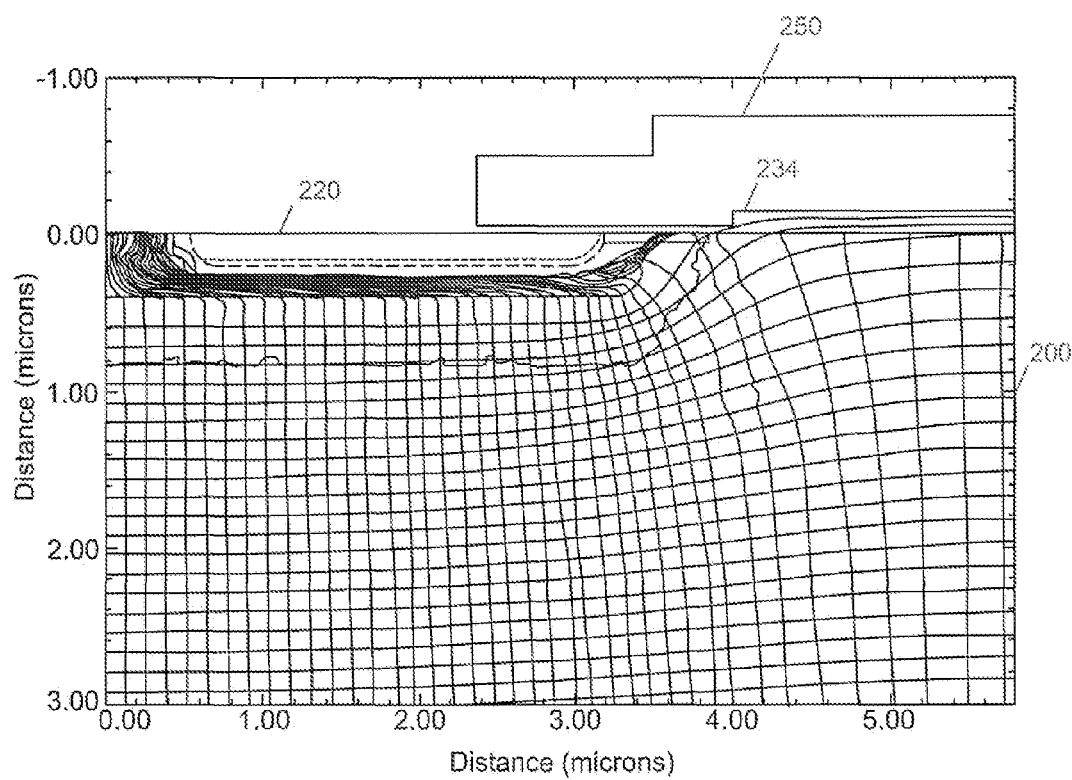
FIG. 14A illustrates a cross-sectional view of an IGFET device having an oxide thickness over a JFET region of 0.15 µm in accordance with one embodiment.
Figure 14B:
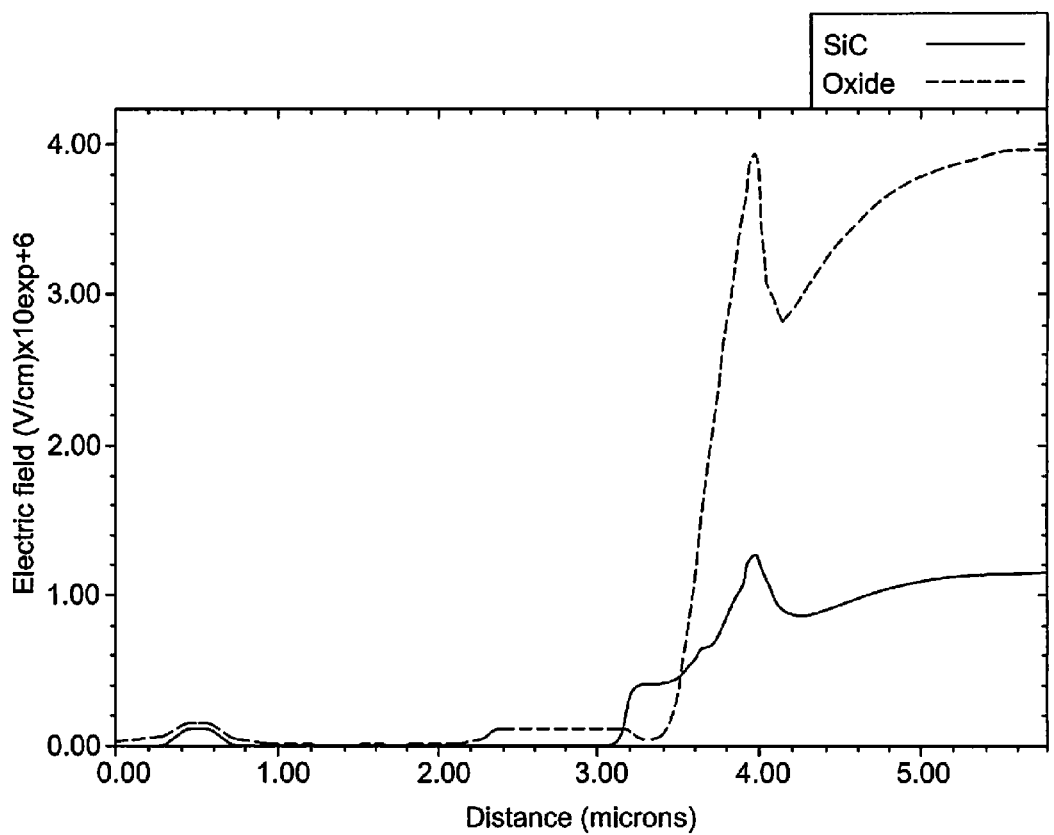
FIG. 14B illustrates an electric field along an SiC—SiO$_2$ interface of the device shown in FIG. 14A.
Figure 15A:
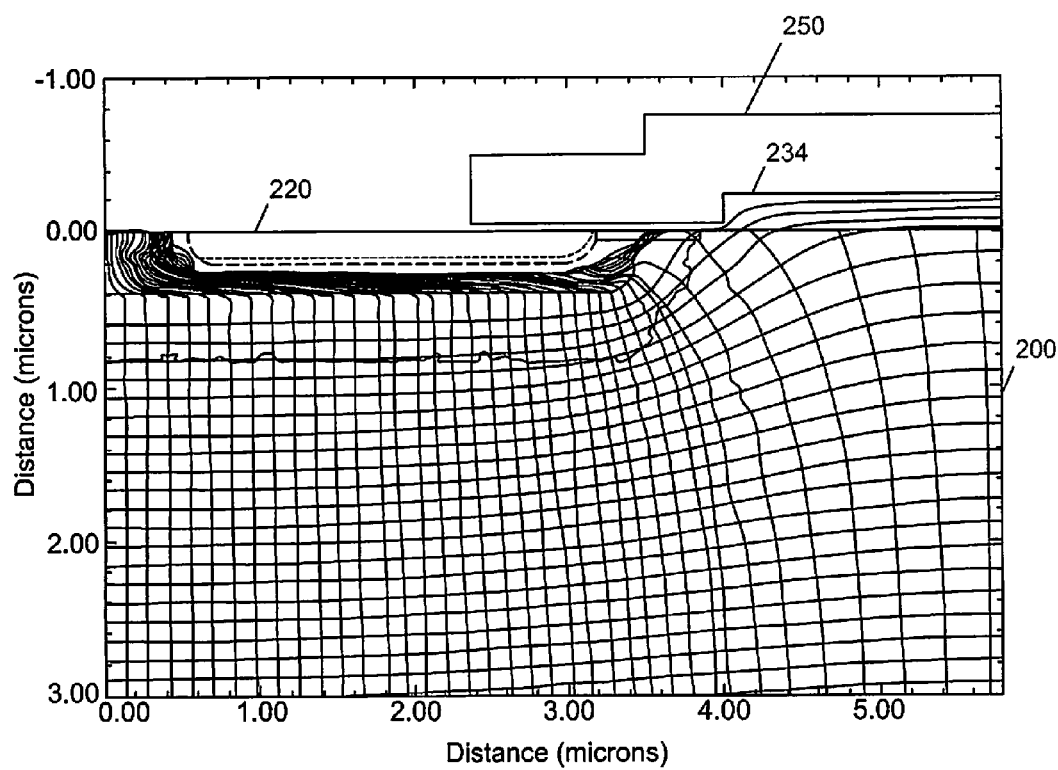
FIG. 15A illustrates a cross-sectional view of an IGFET device having an oxide thickness over a JFET region of 0.25 µm in accordance with one embodiment.
Figure 15B:
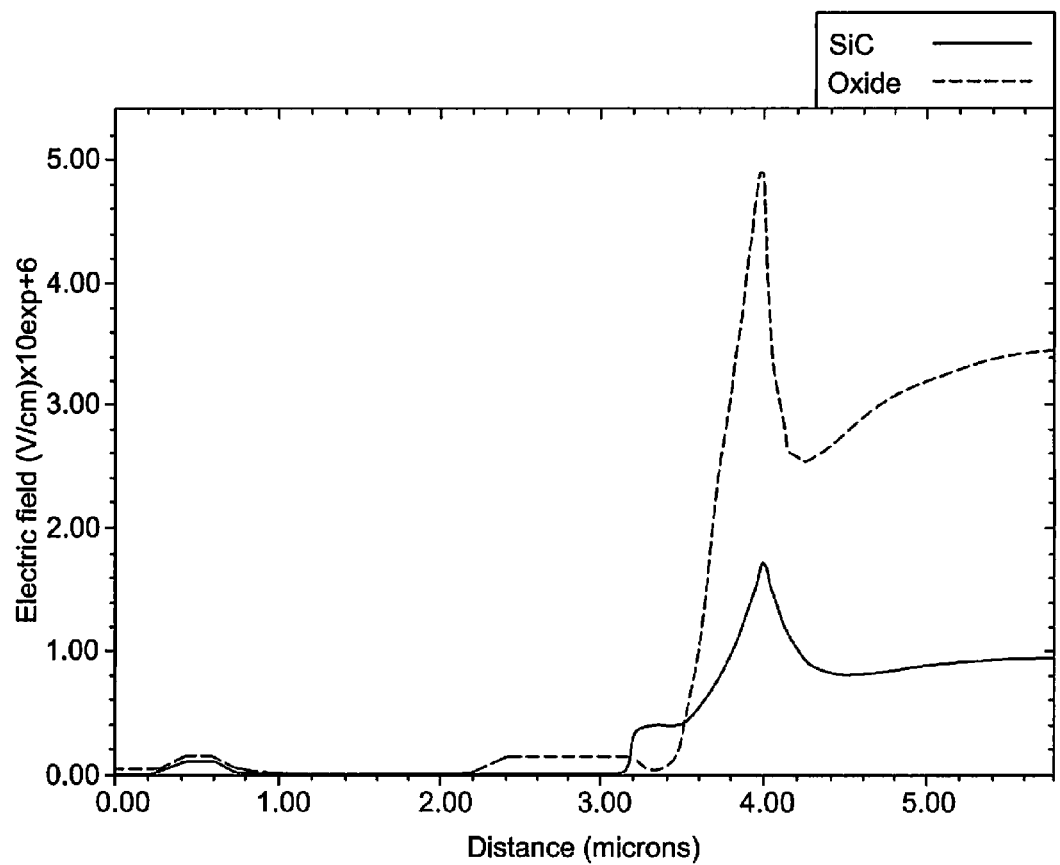
FIG. 15B illustrates an electric field along an SiC—SiO$_2$ interface of the device shown in FIG. 15A.
Figure 16A:
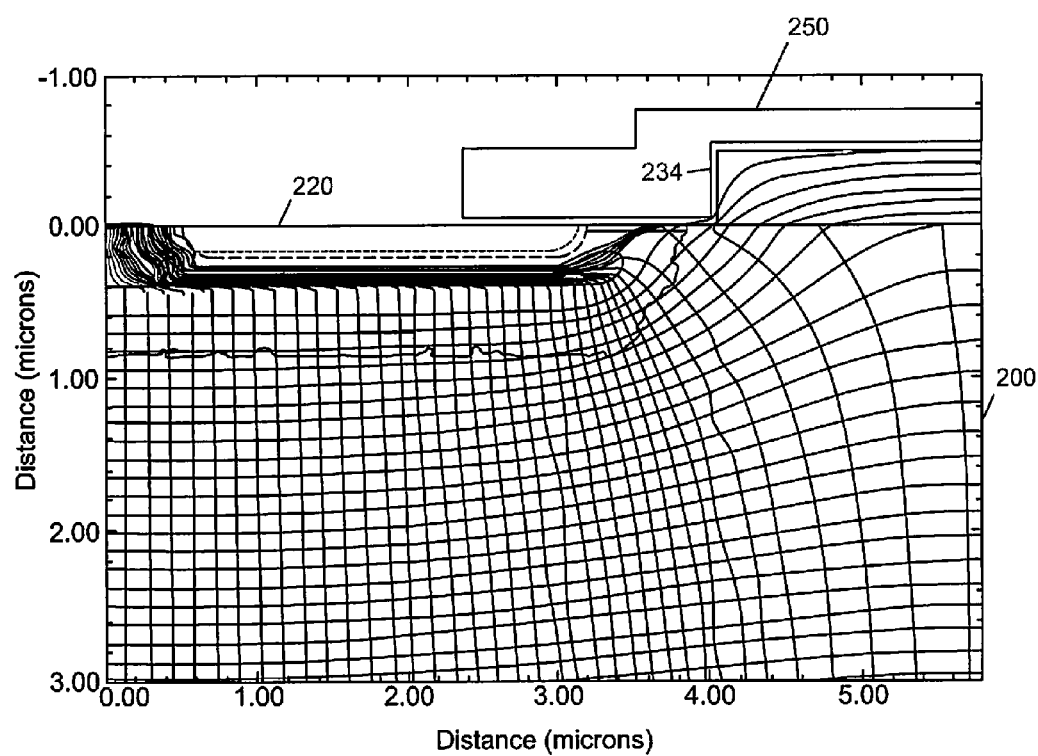
FIG. 16A illustrates a cross-sectional view of an IGFET device having an oxide thickness over a JFET region of 0.55 µm in accordance with one embodiment.
Figure 16B:
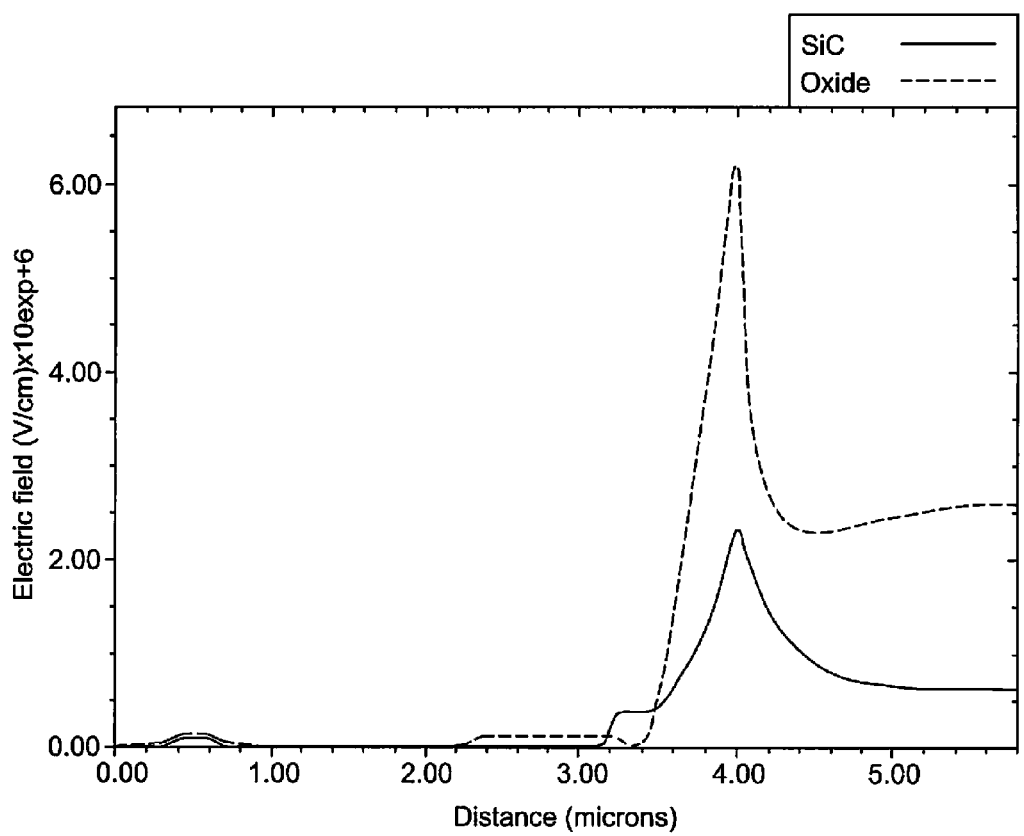
FIG. 16B illustrates an electric field along an SiC—SiO$_2$ interface of the device shown in FIG. 16A.
Figure 17A:
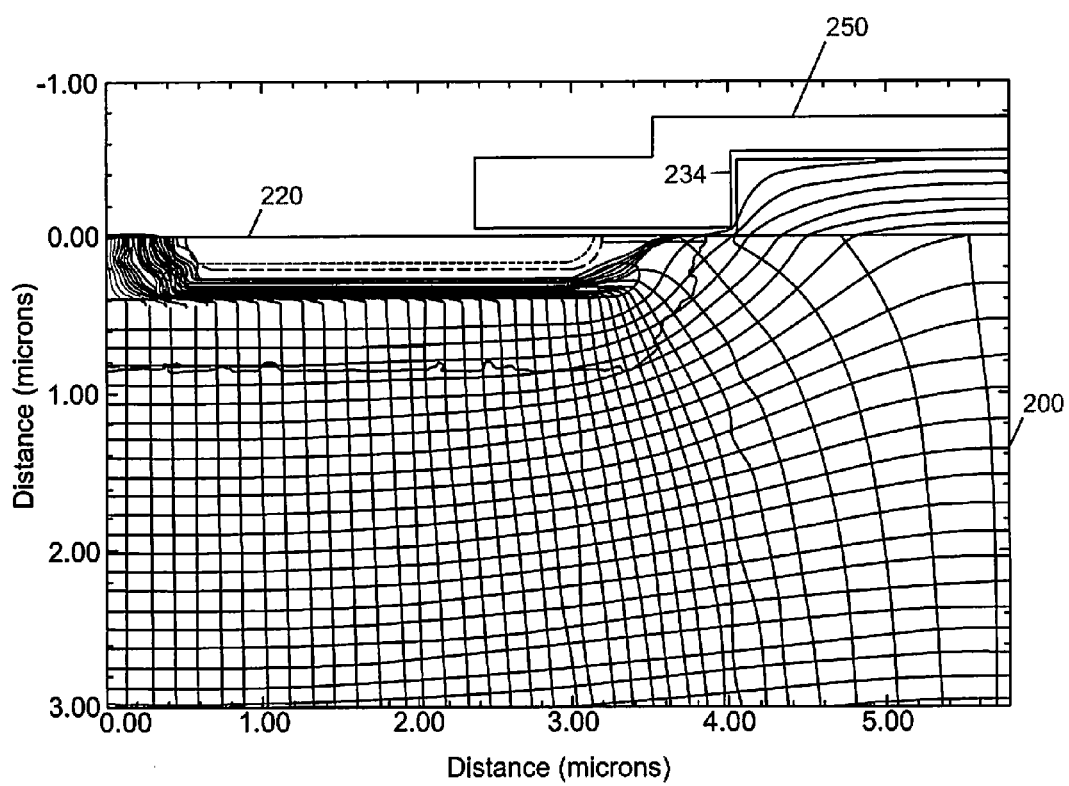
FIG. 17A illustrates a cross-sectional view of an IGFET device having an oxide thickness over a JFET region of 0.55 µm and an oxide taper angle of 90 degrees in accordance with one embodiment.
Figure 17B:
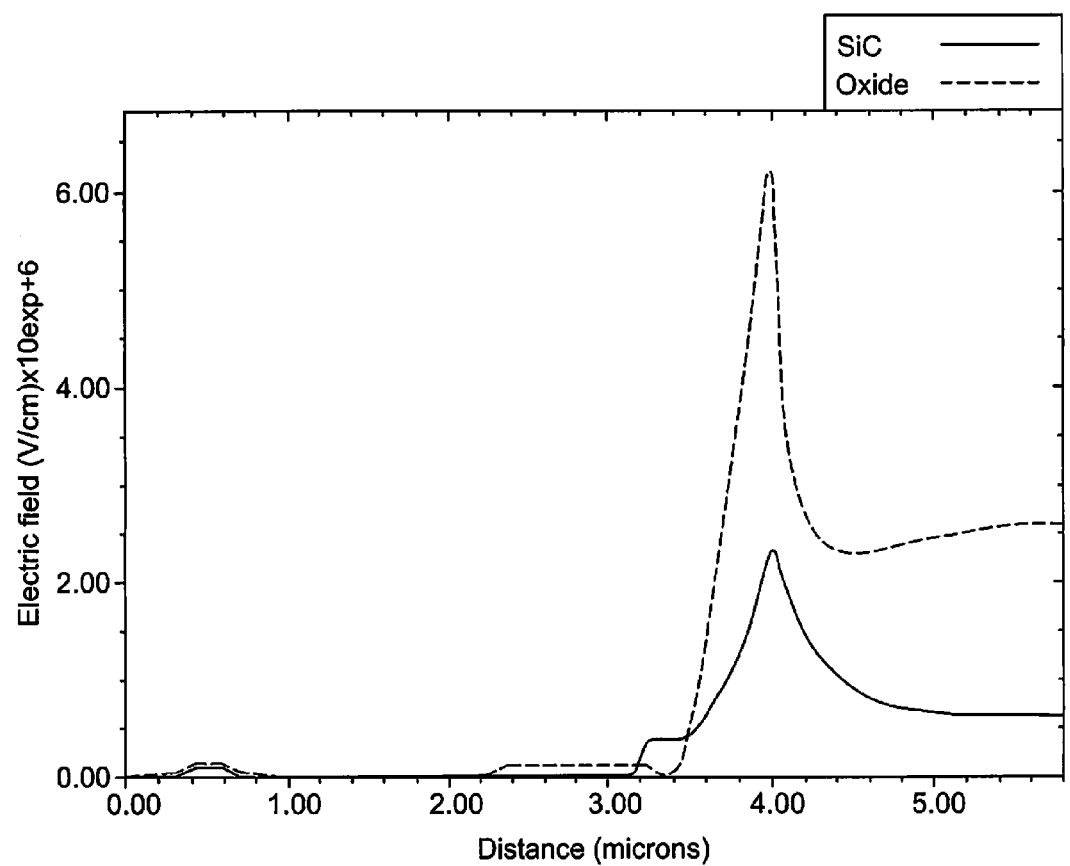
FIG. 17B illustrates an electric field along an SiC—SiO$_2$ interface of the device shown in FIG. 17A.

FIG. 11 is a flowchart of one embodiment of a method 1100 for providing an IGFET device. The method 1100 may be used to create one or more of the IGFET devices described herein, such as the IGFET devices 106, 500, 700, and/or 900 shown in FIGS. 1, 5, 7, and 9. While reference is made herein to the components of the IGFET device 106 shown in FIG. 2, the discussion may equally apply to the similar or same components of the other IGFET devices 500, 700, 900 shown and described herein.

At 1102, a semiconductor body is provided. For example, a layer of a semiconductive material, such as SiC, can be provided. Alternatively, another type of material may be used. The layer may be a layer that is deposited or epitaxially grown on a substrate, or may be provided as a semiconductor wafer. In one embodiment, the semiconductor body is doped, such as with an n-type dopant. The semiconductor body may be relatively lightly doped so that the semiconductor body is an n– doped body. Alternatively, a p-type dopant may be used.

In one embodiment, the semiconductor body may include a doped layer at or near a side of the semiconductor body where a conductive drain will be joined. For example, the layer 214 is typically formed when the body layer 200 is epitaxially grown on a heavily doped substrate 214.

At 1104, first well regions are formed in the semiconductor body. For example, the first well regions 216 may be formed by doping the corresponding volumes of the semiconductor body 200. In one embodiment, the first well regions 216 are formed by covering the volumes of the semiconductor body 200 with a removable mask (e.g., using photolithography) and diffusing and/or ion implanting the dopants into the first well regions 216. The removable mask is then removed from the semiconductor body 200. The first well regions 216 may be formed using a dopant that is oppositely charged from the dopant in the semiconductor body 200. For example, where the semiconductor body 200 is doped with an n-type dopant, the first well regions 216 may be formed using a p-type dopant. Alternatively, where the semiconductor body 200 is doped with a p-type dopant, the first well regions 216 may be formed using an n-type dopant.

In one embodiment, the first well regions 216 may be significantly more heavily doped than the semiconductor body 200. The first well regions 216 may be more heavily doped when the first well regions 216 have a concentration of dopants that is at least one order of magnitude (e.g., 10 times greater) than the concentration of dopants in the semiconductor body 200. Alternatively, the first well regions 216 may be more heavily doped when the first well regions 216 have a concentration of dopants that is at least two orders of magnitude (e.g., 100 times greater) than the concentration of dopants in the semiconductor body 200. In another embodiment, the first well regions 216 may be more heavily doped when the first well regions 216 have a concentration of dopants that is at least three orders of magnitude (e.g., 1,000 times greater) than the concentration of dopants in the semiconductor body 200. However, other different orders of magnitude in the difference of the dopant concentrations may be used.

At 1106, second well regions are formed in the semiconductor body. For example, the second well regions 220 may be formed by doping the corresponding volumes of the semiconductor body 200 inside the first well regions 216. The second well regions 220 can be formed by covering the volumes of the semiconductor body 200 with a removable mask (e.g., using photolithography) and diffusing and/or ion implanting the dopants into the second well regions 220. The removable mask is then removed from the semiconductor body 200. The second well regions 220 may be formed using a dopant that is oppositely charged from the dopant in the first semiconductor regions 216. For example, where the first well regions 216 are doped with a p-type dopant, the second well regions 220 may be formed using an n-type dopant. Alternatively, where the first well regions 216 are doped with an n-type dopant, the second well regions 220 may be formed using a p-type dopant.

At 1110, a gate dielectric is grown or deposited (or both) onto the semiconductor body. For example, the gate oxide 234 may be deposited by covering portions of the semiconductor body 200 where the gate oxide 234 will not be present (e.g., using photolithography) and growing a dielectric layer (e.g., a layer of silicon dioxide) on the exposed portions of the semiconductor body 200. In order to provide a thicker interior portion 246 of the gate oxide 234, a removable mask may be deposited onto the semiconductor body 200 and growing the thinner outer portions 244, 248 and a first part of the interior portion 246 on the areas of the semiconductor body 200 that are exposed by the mask. Then, the mask may be removed and another removable mask may be provided that covers the outer portions 244, 248 of the gate oxide 234 while exposing the interior portion 246. The remaining thickness of the interior portion 246 of the gate oxide 234 can then be grown and the mask can be removed.

At 1112, conductive contacts are deposited onto the semiconductor body. For example, the gate contact 250, the source contact 210, and the drain contact 206 may be provided. The drain contact 206 may be provided by sputtering or otherwise depositing one or more metals, metal alloys, polysilicon materials, and the like, onto the bottom side 208 of the semiconductor body 200. The source contact 210 and/or the gate contact 250 may be formed by forming a removable mask on the semiconductor body 200 (e.g., using photolithography) and sputtering or otherwise depositing one or more metals, metal alloys, polysilicon materials, and the like, onto the top side 212 of the semiconductor body 200. The removable mask may then be removed.

Once fabrication of the IGFET device 106 is complete, the source contact 210 may be conductively coupled with a source of electric current, the drain contact 204 may be conductively coupled with an electric load, and the gate contact 250 can be conductively coupled with a control unit that controls when a gate signal is applied to the gate contact 250, as described above.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. While the dimensions and types of materials described herein are intended to define the parameters of the inventive subject matter, they are by no means limiting and are exemplary embodiments. Many other embodiments will be apparent to one of ordinary skill in the art upon reviewing the above description. The scope of the subject matter described herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose several embodiments of the inventive subject matter, including the best mode, and also to enable any person of ordinary skill in the art to practice the embodiments disclosed herein, including making and using any devices or systems and performing any incorporated methods. The patentable scope of the subject matter is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present inventive subject matter are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

What is claimed is:

1. An insulating gate field effect transistor (IGFET) device comprising:
    a silicon carbide containing semiconductor body conductively coupled with a source contact and a drain contact, the semiconductor body including a first well region comprising a first volume of the semiconductor body that is disposed at a first side of the semiconductor body and that is doped with a first type of dopant, the semiconductor body including a second well region comprising a second volume of the semiconductor body that is disposed at the first side of the semiconductor body and that is doped with an oppositely charged second type of dopant, the second well region disposed within the first well region; and
    a gate oxide coupled with the semiconductor body and with a gate contact, the gate oxide including an outer section and an interior section having different thickness dimensions, the outer section disposed over the first well region and the second well region of the semiconductor body, the interior section disposed over a junction gate field effect transistor region of the semiconductor body, wherein the semiconductor body is configured to form a conductive channel from the source contact to the drain contact through the second well region and the junction gate field effect transistor region when a gate signal is applied to the gate contact.

2. The IGFET device of claim 1, wherein the outer section of the gate oxide has a smaller thickness dimension than the interior section of the gate oxide.

3. The IGFET device of claim 1, wherein the semiconductor body includes a plurality of the first well regions separated from each other by the junction gate field effect transistor region of the semiconductor body.

4. The IGFET device of claim 3, wherein the interior section of the gate oxide extends over the junction gate field effect transistor region of the semiconductor body from a first one of the first well regions in the plurality of first well regions to a second one of the first well regions in the plurality of first well regions.

5. The IGFET device of claim 1, wherein the interior section of the gate oxide has a thickness dimension that is at least 0.25 microns thick.

6. The IGFET device of claim 1, wherein the interior section of the gate oxide has a thickness dimension that is at least 0.55 microns thick.

7. The IGFET device of claim 1, wherein the interior section of the gate oxide has a thickness dimension that is at least 0.55 microns thick and a tapered outer edge angle of between 30 and 50 degrees.

8. The IGFET device of claim 7, wherein the tapered outer edge angle is 45 degrees.

9. A method comprising:
doping a silicon carbide containing semiconductor body with a first type of dopant in a first volume of the semiconductor body to form a first well region;
doping the semiconductor body with an oppositely charged second type of dopant in a second volume of the semiconductor body to form a second well region, the second well region disposed within the first well region;
providing a gate oxide on the semiconductor body, the gate oxide including an outer section and an interior section having different thickness dimensions, the outer section disposed over the first well region and the second well region of the semiconductor body, the interior section disposed over a junction gate field effect transistor region of the semiconductor body;
conductively coupling a source contact with at least one of the first well region or the second well region of the semiconductor body, a drain contact with the semiconductor body, and a gate contact with the gate oxide, wherein the semiconductor body is configured to form a conductive channel from the source contact to the drain contact through the second well region and the junction gate field effect transistor region when a gate signal is applied to the gate contact.

10. The method of claim 9, wherein providing the gate oxide includes forming the gate oxide such that the outer section has a smaller thickness dimension than the interior section.

11. The method of claim 9, wherein providing the gate oxide includes forming the outer section and the inner section as a continuous oxide body.

12. The method of claim 9, wherein doping the first volumes of the semiconductor body includes doping to form a plurality of the first well regions separated from each other by the junction gate field effect transistor region of the semiconductor body.

13. The method of claim 12, wherein the interior section of the gate oxide is positioned to extend over the junction gate field effect transistor region of the semiconductor body from a first one of the first well regions in the plurality of first well regions to a second one of the first well regions in the plurality of first well regions.

14. The method of claim 9, wherein the interior section of the gate oxide has a thickness dimension that is at least 0.55 microns thick.

15. The method of claim 9, wherein the interior section of the gate oxide has a thickness dimension that is at least 0.55 microns thick and a tapered outer edge angle of between 30 and 50 degrees.

16. The method of claim 15, wherein the tapered outer edge angle is 45 degrees.

17. An insulating gate field effect transistor (IGFET) device comprising:
a silicon carbide containing semiconductor body having first well regions doped with a first type of dopant and second well regions doped with an oppositely charged second type of dopant, the second well regions disposed in the first well regions, the first well regions separated from each other by a junction gate field effect transistor region of the semiconductor body, the semiconductor body configured to be conductively coupled with a drain contact and at least one of the first well regions or the second well regions configured to be conductively coupled with a source contact; and
a gate oxide disposed over semiconductor body and configured to be conductively coupled with a gate contact, the gate oxide having an interior section disposed over the junction gate field effect transistor region of the semiconductor body and outer sections at least partially disposed over the first well regions, wherein the interior section of the gate oxide has a first thickness dimension that is different from a second thickness dimension of the outer sections.

18. The IGFET device of claim 17, wherein the first thickness dimension of the interior section of the gate oxide is larger than the second thickness dimension of the outer sections of the gate oxide.

19. The IGFET device of claim 17, wherein the interior section and the outer sections of the gate oxide form a continuous oxide body.

20. The IGFET device of claim 17, wherein the first thickness dimension of the interior section of the gate oxide has a thickness dimension that is at least 0.25 microns thick.

21. The IGFET device of claim 17, wherein the interior section of the gate oxide has a thickness dimension that is at least 0.55 microns thick.

22. The IGFET device of claim 17, wherein the interior section of the gate oxide has a thickness dimension that is at least 0.55 microns thick and a tapered outer edge angle of between 30 and 50 degrees.

23. The IGFET device of claim 22, wherein the tapered outer edge angle is 45 degrees.

* * * * *